(12) United States Patent
Hsiao et al.

(10) Patent No.: US 11,201,064 B2
(45) Date of Patent: Dec. 14, 2021

(54) SIGNAL LINE PATTERNING FOR STANDARD CELLS

(71) Applicant: Taiwan Semiconductor Manufacturing Co., Ltd., Hsinchu (TW)

(72) Inventors: Chih-Min Hsiao, Hsinchu (TW); Chien-Wen Lai, Hsinchu (TW); Ru-Gun Liu, Hsinchu (TW); Chih-Ming Lai, Hsinchu (TW); Wei-Shuo Su, Hsinchu (TW); Yu-Chen Chang, Hsinchu (TW)

(73) Assignee: TAIWAN SEMICONDUCTOR MANUFACTURING CO, LTD., Hsinchu (TW)

( * ) Notice: Subject to any disclaimer, the term of this patent is extended or adjusted under 35 U.S.C. 154(b) by 7 days.

(21) Appl. No.: 16/894,545

(22) Filed: Jun. 5, 2020

(65) Prior Publication Data

US 2021/0066091 A1 Mar. 4, 2021

Related U.S. Application Data

(60) Provisional application No. 62/894,571, filed on Aug. 30, 2019.

(51) Int. Cl.
*H01L 21/311* (2006.01)
*H01L 21/768* (2006.01)
*H01L 21/027* (2006.01)

(52) U.S. Cl.
CPC .... *H01L 21/31144* (2013.01); *H01L 21/0274* (2013.01); *H01L 21/76802* (2013.01); *H01L 21/76877* (2013.01)

(58) Field of Classification Search
CPC ......... H01L 21/31144; H01L 21/76877; H01L 21/76802; H01L 21/0274; H01L 21/76816; H01L 23/5286; H01L 21/0337; H01L 21/4846
See application file for complete search history.

(56) References Cited

U.S. PATENT DOCUMENTS

| | | | |
|---|---|---|---|
| 10,073,342 B2* | 9/2018 | Chou | H01L 21/31144 |
| 2015/0155198 A1* | 6/2015 | Tsai | H01L 21/0332 438/674 |
| 2018/0323061 A1* | 11/2018 | Raley | H01L 21/0337 |

* cited by examiner

*Primary Examiner* — Karen Kusumakar
(74) *Attorney, Agent, or Firm* — Seed IP Law Group LLP

(57) ABSTRACT

A four signal line unit cell is formed on a substrate using a combination of an extreme ultraviolet photolithography process and one or more self aligned deposition processes. The photolithography process and the self aligned deposition processes result in spacers on a hard mask above the substrate. The spacers define a pattern of signal lines to be formed on the substrate for a unit cell. The photolithography process and self aligned deposition processes result in signal lines having a critical dimension much smaller than features that can be defined by the extreme ultraviolet photolithography process.

20 Claims, 44 Drawing Sheets

SIGNAL LINE PATTERNING FOR STANDARD CELLS

PRIORITY CLAIM AND CROSS-REFERENCE

The present application claims priority benefit from U.S. Provisional Patent Application No. 62/894,571, filed on Aug. 30, 2019, titled PATTERNING SOLUTIONS FOR 4 METAL TRACK STANDARD CELLS. U.S. Provisional Patent Application No. 62/894,571 is incorporated herein by reference.

BACKGROUND

In the formation of an integrated circuit, standard cells having predetermined functions are used. Pre-designed layouts of standard cells are stored in cell libraries. When designing an integrated circuit, the pre-designed layouts of the standard cells are retrieved from the cell libraries and placed into one or more desired locations on an integrated circuit layout. Routing is then performed to connect the standard cells with each other using signal lines. The integrated circuit layout is thereafter used to manufacture the integrated circuit using a predetermined semiconductor manufacturing process.

Standard cells are typically laid out relative to a routing grid, which defines horizontal and vertical tracks where the over-the-cell metal routing is formed. In particular, the height of a standard cell is determined by the number of horizontal routing tracks (i.e., signal lines) extending between the uppermost and lowermost edges of the cell, and the width of a standard cell is determined by vertical routing tracks extending between the leftmost and rightmost points of the cells. Typically, to facilitate the placement and routing process, most cells of a standard cell library have the same height (or multiples thereof), and the uppermost and lowermost horizontal tracks of the standard cell are reserved for power rails, VDD and VSS, respectively.

Low power application-specific integrated circuits (ASICs) tend to use short cells for high density. The cell height is determined by the number of signal lines within the cell. The cell height thus constrains the number of signal lines in the first metal layer for cell internal routing. In advance technology nodes, for example, N10 and beyond, 4-signal line standard cells having four signal lines extending along horizontal signal lines are used. The power rails and the signal lines are formed in the same metal layer, for example, a first metal layer, above a semiconductor substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
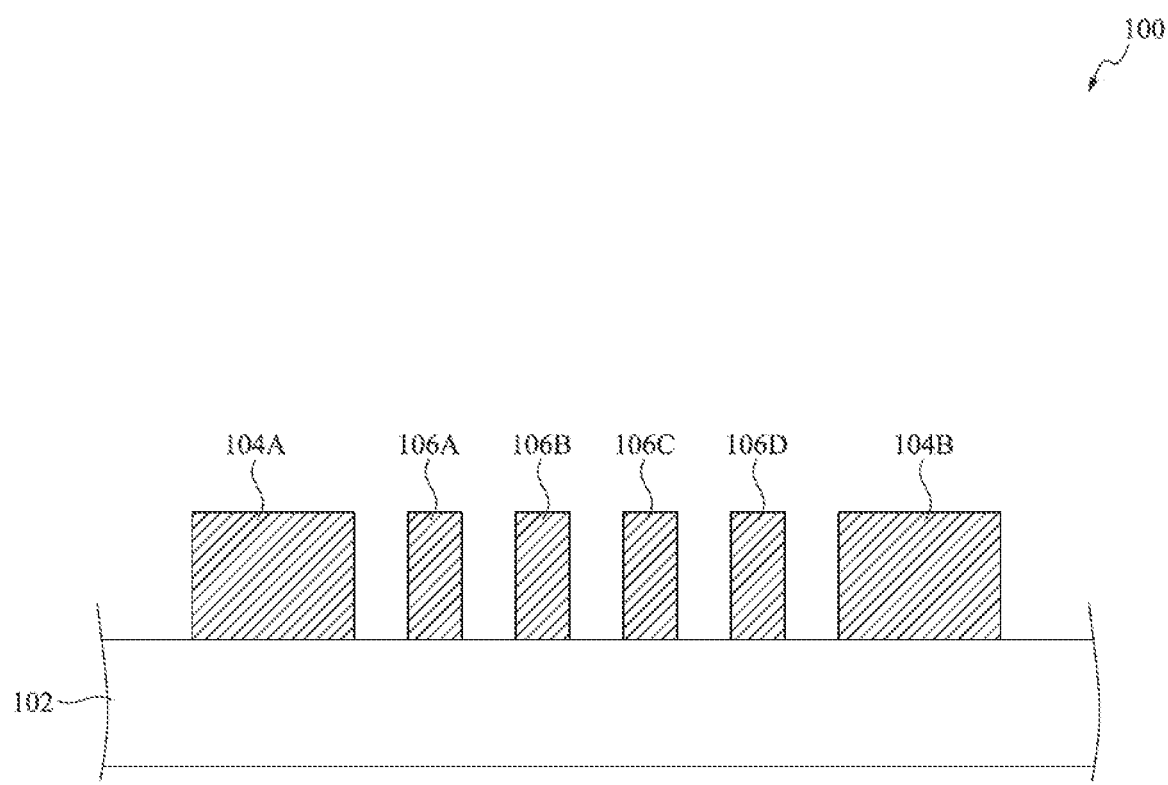
FIG. 1A is a cross-sectional view of an integrated circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a cross-sectional view of an integrated circuit 100 at an intermediate stage of processing, according to one embodiment. The integrated circuit 100 includes a substrate 102. The integrated circuit 100 includes voltage supply tracks 104A, 104B positioned on the substrate 102. The integrated circuit 100 also includes four signal lines 106A-106D positioned on the substrate 102 between the voltage supply tracks 104A, 104B.

Figure 1B:
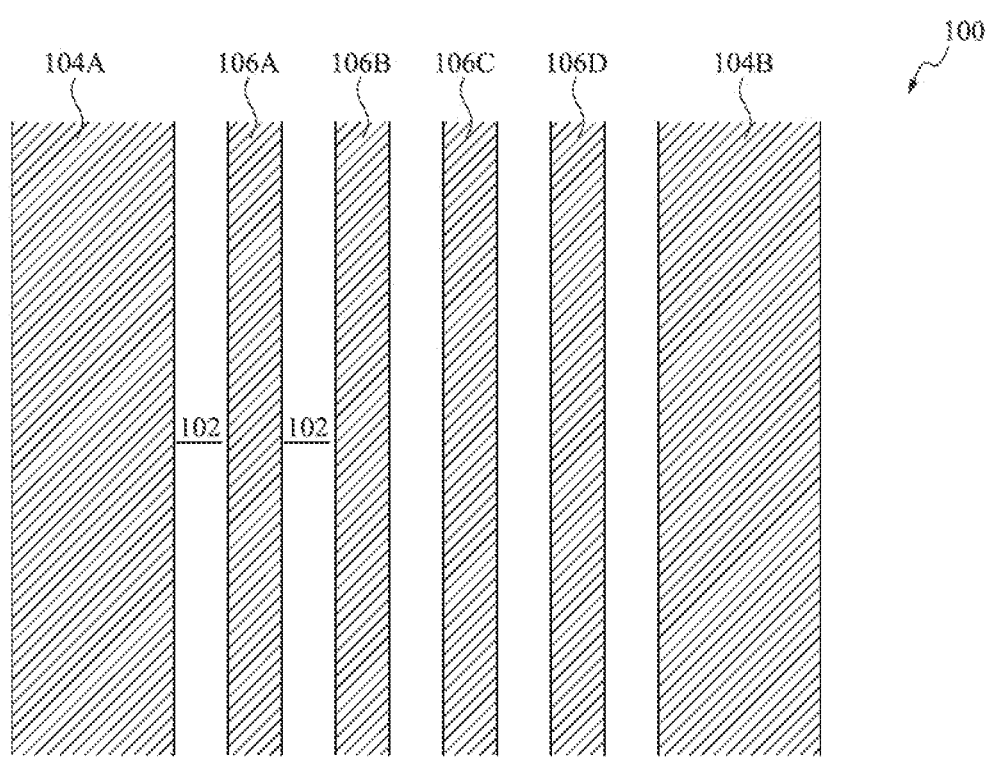
FIG. 1B is a top view of the integrated circuit of FIG. 1A, in accordance with some embodiments.

FIG. 1B is a top view of the integrated circuit 100 of FIG. 1A, according to one embodiment. In the view of FIG. 1B, the voltage supply tracks 104A, 104B and the signal lines 106A-106D extend along the surface of the substrate 102 substantially parallel to each other, though beyond the view of FIG. 1B the signal lines 106A-106D may include curves, bends, breaks, and connections with each other.

With reference to FIGS. 1A and 1B, in one embodiment, the supply tracks 104A and 104B and the signal lines 106A-106D represent a four signal line standard cell. As integrated circuit features continue to shrink in size, the pitch and critical dimensions of the signal lines 106A-106D also shrink. In one embodiment, the pitch (i.e. the distance from the center of one signal line 106 to the center of an adjacent signal line 106) is between 20 nm and 40 nm. In one embodiment, the critical dimension (i.e. the size of the smallest feature, in this case the distance between adjacent signal lines) is between 10 nm and 20 nm. In one example, the pitch is 36 nm and the critical dimension is 18 nm. Other values for the pitch and critical dimension can be utilized without departing from the scope of the present disclosure.

In one embodiment, the supply tracks 104A and 104B and the signal lines 106A-106D include a conductive material. The conductive material can include one or more of copper, aluminum, silicon, gold, or other electrically conductive materials. In one example the supply tracks 104A and 104B and the signal lines 106A-106D are copper. Other materials and alloys can be utilized for the supply tracks 104A and 104B and the signal lines 106A-106D without departing from the scope of the present disclosure. Though the term "supply track" is applied herein to the wider metal tracks that carry supply voltages, and though the term "signal line" is applied herein to the thinner metal tracks between the supply tracks, both the supply tracks and the signal lines can be referred as metal lines, metal tracks, or other interchangeable terms.

In one embodiment, the substrate 102 can include a monocrystalline semiconductor substrate. The monocrystalline semiconductor substrate can include transistors, diodes, and other types of circuit elements commonly formed in conjunction with semiconductor substrates. Portions of the circuit elements may be formed entirely within the semiconductor substrate. Other portions of the circuit elements may be formed on the surface of the semiconductor substrate. The supply tracks 104A and 104B and the signal lines 106A-106D can provide supply voltages and can relay signals to and from the various circuit elements associated with a semiconductor substrate. The semiconductor substrate can include one or more of silicon, germanium, silicon germanium, gallium, gallium arsenide, or other types of semiconductor materials. Many types of semiconductor materials other than those described above can be utilized.

In one embodiment, the substrate 102 can include one or more layers of dielectric material. The one or more layers of dielectric material can include silicon oxide, silicon nitride, porous silicon oxide, or other dielectric materials commonly used in integrated circuit processing. Many kinds of dielectric materials others than those listed above can be utilized without departing from the scope of the present disclosure.

In one embodiment, the substrate 102 can include various layers of semiconductor material, dielectric material, and conductive materials. Accordingly, in one example, the substrate 102 can refer to a group of layers positioned below the supply tracks 104A-104B and the signal lines 106A-106D. Many types of layers of materials can be utilized in the substrate 102 without departing from the scope of the present disclosure.

FIGS. 2A-27 include various cross-sectional views and top views of an integrated circuit 100 at various stages of processing. FIGS. 2A-27 illustrate process steps for various embodiments for producing an integrated circuit 100 including the supply tracks 104A-104B and the signal lines 106A-106D of FIGS. 1A and 1B.

Figure 2A:
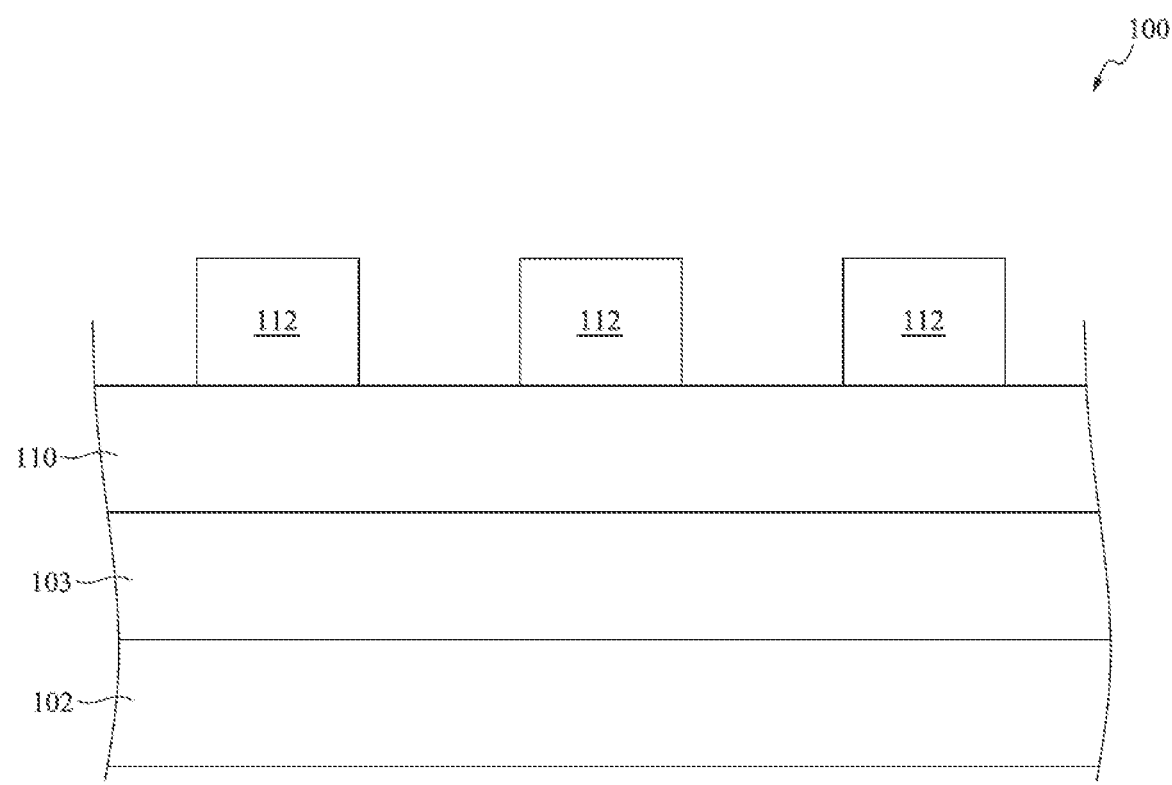
FIG. 2A-27 are various cross-sectional views and top views of an integrated circuit at intermediate stages of processing, in accordance with some embodiments.

FIG. 2A is a cross-sectional view of an integrated circuit 100 at an intermediate stage of processing, according to one embodiment. The integrated circuit 100 includes a substrate 102, a first hard mask layer 103 positioned on the substrate 102, a second hard mask layer 110 positioned on the first hard mask layer 103, and a plurality of mandrels 112 positioned on the second hard mask layer 110.

In one embodiment, the first hard mask layer 103 is a metal hard mask layer. The metal hard mask layer can include ruthenium. The ruthenium can have a thickness between 5 nm and 200 nm. Other materials and thicknesses can be utilized for the hard mask layer 103 without departing from the scope of the present disclosure.

In one embodiment, the first hard mask layer 103 can be deposited by one or more thin-film deposition processes. The thin-film deposition processes can include one or more of chemical vapor deposition, plasma enhanced chemical vapor deposition, physical vapor deposition, plasma enhanced physical vapor deposition, sputtering, atomic layer deposition, or other types of thin-film deposition processes. Thin-film deposition processes other than those described above can be utilized for the first hard mask layer 103 without departing from the scope of the present disclosure.

In one embodiment, the second hard mask layer 110 includes a material that is selectively etchable with respect to the first hard mask layer 103. In one example, the second hard mask layer 110 includes titanium nitride. The second hard mask layer 110 has a thickness between 5 nm and 200 nm. Other materials and thicknesses can be utilized for the second hard mask layer 110 without departing from the scope of the present disclosure.

In one embodiment, the second hard mask layer 110 can be deposited by one or more thin-film deposition processes. The thin-film deposition processes can include one or more of chemical vapor deposition, plasma enhanced chemical vapor deposition, physical vapor deposition, plasma enhanced physical vapor deposition, sputtering, atomic layer deposition, or other types of thin-film deposition processes. Thin-film deposition processes other than those described above can be utilized for the second hard mask layer 110 without departing from the scope of the present disclosure.

In one embodiment, the mandrels 112 are utilized as a first patterning step for forming the supply tracks 104A and 104B and the signal lines 106A-106D of FIGS. 1A and 1B. The mandrels are formed by depositing a layer of dielectric material. The layer of dielectric material can include silicon dioxide or other dielectric materials. The thickness of the layer of dielectric material for the mandrels 112 can be between 10 nm and 500 nm. Other materials and thicknesses can be utilized for the material of the mandrels 112 without departing from the scope of the present disclosure.

The mandrels 112 have a width that is approximately the same as the width of the supply tracks 104A and 104B. Additionally, the distance between the mandrels 112 is approximately the same as the width of the supply tracks 104A and 104B. Accordingly, advantageously, the mandrels 112 have a critical dimension that is double the critical dimension of the signal lines 106A-106D. Thus, the formation of the mandrels 112 has relatively relaxed photolithography requirements.

In one embodiment, the mandrels 112 are formed from a layer of dielectric material by a first photolithography process. In particular, photoresist is deposited on the on the layer of dielectric material. The photoresist is then irradiated with extreme ultraviolet light through a mask. The mask defines the pattern of the mandrels. The photoresist that is exposed to the extreme ultraviolet light undergoes a chemical change and is then selectively removed using standard photolithography processes. After the photoresist has been patterned, the layer of dielectric material is etched. The etching process results in the mandrels 112 being formed on the second hard mask layer 110. The etching process can include a wet etch, dry etch, or any suitable etching process for etching the layer of dielectric material to form the mandrels 112.

Figure 2B:
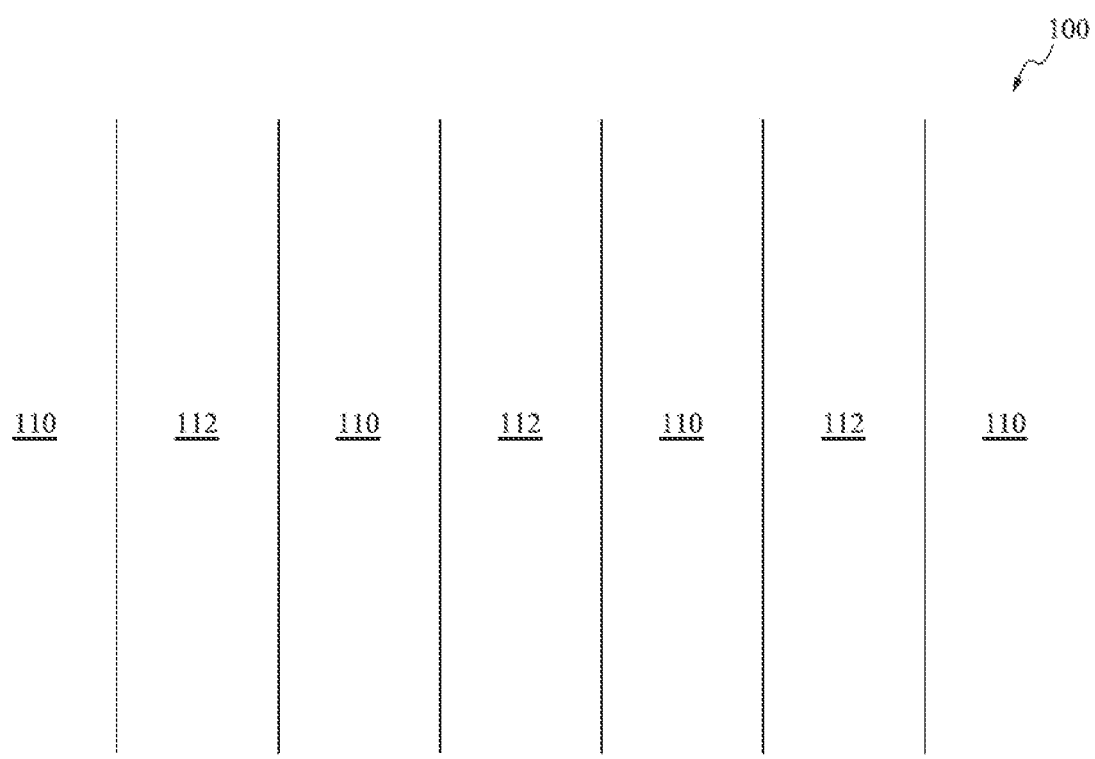

FIG. 2B is a top view of the integrated circuit 100 at the processing stage of FIG. 2A, according to one embodiment. The top view of FIG. 2B illustrates the mandrels 112 formed on the second hard mask layer 110. Portions of the second hard mask layer 110 are exposed between the mandrels 112. As described previously, each of the mandrels 112 has a width approximately the same as the width of the supply tracks 104A and 104B. The gaps between the mandrels 112 have a width approximately the same as the width of the supply tracks 104A and 104B.

Figure 3A:
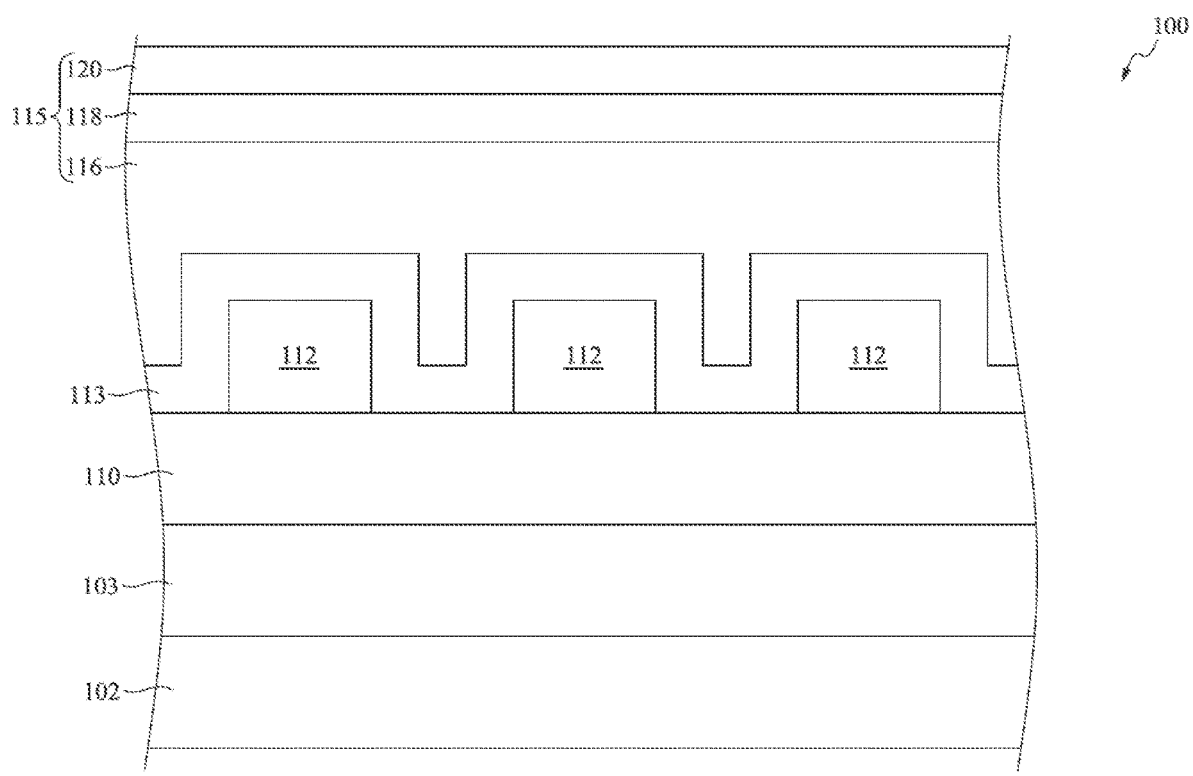

FIG. 3A is a cross-sectional view of an integrated circuit 100 at an intermediate stage of processing, according to one embodiment. In the view of FIG. 3, a first spacer layer 113 has been deposited on the top surfaces of the mandrels 112, on the sidewalls of the mandrels 112, and on the exposed portions of the second hard mask layer 110.

In one embodiment, the spacer first layer 113 has a thickness corresponding to the desired gap between supply tracks 104A or 104B and adjacent signal lines 106A-106D. The thickness of the first spacer layer 113 also corresponds to the desired gap between adjacent signal lines 106A-106D. Accordingly, in one embodiment, the spacer layer 113 has a thickness corresponding to the critical dimension of the unit cell. This critical dimension, in one embodiment, is about one-third the width of the supply tracks 104A and 104B.

In one embodiment, the first spacer layer 113 is a material that is selectively etchable with respect to the material of the mandrels 112. The first spacer layer 113 can include a metal material, dielectric material, or ceramic material. In one example, the first spacer layer 113 is titanium oxide. The thickness of the first spacer layer is between 10 nm and 20 nm. Other materials and thicknesses of the first spacer layer 113 can be utilized without departing from the scope of the present disclosure.

In one embodiment, the first spacer layer 113 can be deposited by one or more thin-film deposition processes. The thin-film deposition processes can include one or more of chemical vapor deposition, plasma enhanced chemical vapor deposition, physical vapor deposition, plasma enhanced physical vapor deposition, sputtering, atomic layer deposition, or other types of thin-film deposition processes. Thin-film deposition processes other than those described above can be utilized for the first spacer layer 113 without departing from the scope of the present disclosure.

In one embodiment, a three layer mask stack 115 is deposited on the first spacer layer 113. The mask stack 115 includes a bottom layer 116, a middle layer 118, and a top layer 120. In one embodiment, the bottom layer 116 is a first photoresist layer. The bottom layer 116 can include an organic photoresist layer. Alternatively, the bottom layer 116 can be a layer of dielectric material such as silicon nitride or silicon dioxide. The bottom layer 116 can be deposited by one or more thin-film deposition processes. The thin-film deposition processes can include one or more of chemical vapor deposition, plasma enhanced chemical vapor deposition, physical vapor deposition, plasma enhanced physical vapor deposition, sputtering, atomic layer deposition, or other types of thin-film deposition processes. Thin-film deposition processes other than those described above can be utilized for the bottom layer 116 without departing from the scope of the present disclosure.

In one embodiment, the middle layer 118 is a layer of dielectric material. In one example, the middle layer 118 is titanium oxide. The thickness of the first spacer layer is between 10 nm and 20 nm. Other materials and thicknesses of the middle layer can be utilized without departing from the scope of the present disclosure In one embodiment, the middle layer 118 can be deposited by one or more thin-film deposition processes. The thin-film deposition processes can include one or more of chemical vapor deposition, plasma enhanced chemical vapor deposition, physical vapor deposition, plasma enhanced physical vapor deposition, sputtering, atomic layer deposition, or other types of thin-film deposition processes. Thin-film deposition processes other than those described above can be utilized for the middle layer 118 without departing from the scope of the present disclosure.

In one embodiment, the top layer 120 includes an organic dielectric material. The organic dielectric material dielectric material have a thickness between 10 nm and 500 nm. In one embodiment, the top layer 120 can be deposited by one or more thin-film deposition processes. The thin-film deposition processes can include one or more of chemical vapor deposition, plasma enhanced chemical vapor deposition, physical vapor deposition, plasma enhanced physical vapor deposition, sputtering, atomic layer deposition, or other types of thin-film deposition processes. Other thicknesses, materials, and deposition processes can be used for the top layer 120 of the mask stack without departing from the scope of the present disclosure.

The purpose of the mask stack 115 is to form patterns for making breaks in the signal lines 106A and 106D. Though not visible in the view of FIG. 3A, trenches 121 are made in the mask stack 115. The positions of these trenches correspond to the position at which there will be breaks in the signal lines 106A and 106D. The trenches can be made using standard photolithography processes. The trenches may be formed significantly wider than will be the final breaks in the signal lines, as will be described in more detail below. The top photoresist layer 120 fills these trenches and is positioned on the first spacer layer 113 at locations corresponding to the locations for the breaks in the signal lines 106A and 106D. Example positions of these breaks are seen in the top view of FIG. 4B as remaining portions of an organic dielectric material 124 described in more detail below.

Figure 3B:
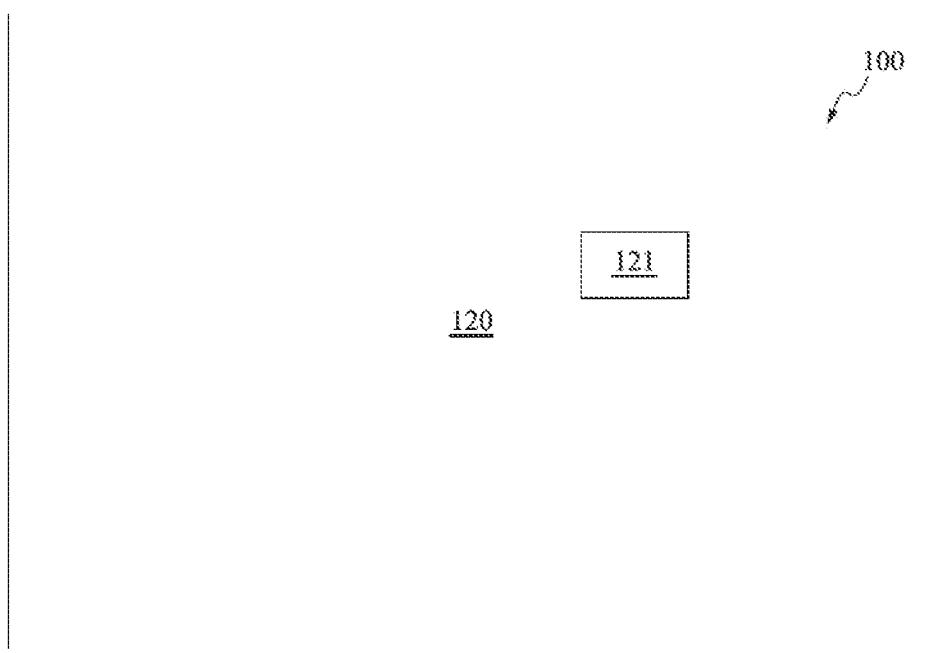

FIG. 3B is a top view of the integrated circuit 100 of FIG. 3A. A trench 121 has been formed in the top layer 120 by photolithography processes. For example, the photoresist layer 120 can be patterned by exposure to irradiation through a mask in order to form the trench 121. The middle layer 118 and the bottom layer 116 can then be etched by one or more etching processes to expose the first spacer layer 113 under the trench. For example, a first etching process can etch the exposed portion the middle layer 118. A second subsequent etching process can etch the exposed portion of the bottom layer 116.

In one embodiment, after the first spacer layer 113 has been exposed via the trench 121, the top layer 120 is removed via one or more etching processes. An organic dielectric material 124 is then deposited on the first spacer layer 113 in the trench 121. The organic dielectric material 124 can be deposited by one or more thin-film deposition processes. The thin-film deposition processes can include one or more of chemical vapor deposition, plasma enhanced chemical vapor deposition, physical vapor deposition, plasma enhanced physical vapor deposition, sputtering, atomic layer deposition, or other types of thin-film deposition processes. Thin-film deposition processes other than those described above can be utilized for the organic dielectric material 124 without departing from the scope of the present disclosure. Other materials can be used in the place of the organic dielectric material 124 without departing from the scope of the present disclosure.

After the organic dialectic material 124 is deposited, the organic dielectric material 124 and the middle layer 128 are etched back via one or more etching processes. The one or more etching processes can include wet etches, dry etches, a combination of wet and dry etches, or other types of etching processes. The bottom layer 116 is then entirely removed via one or more etching processes such as those described above, or other types of etching processes.

Figure 4A:
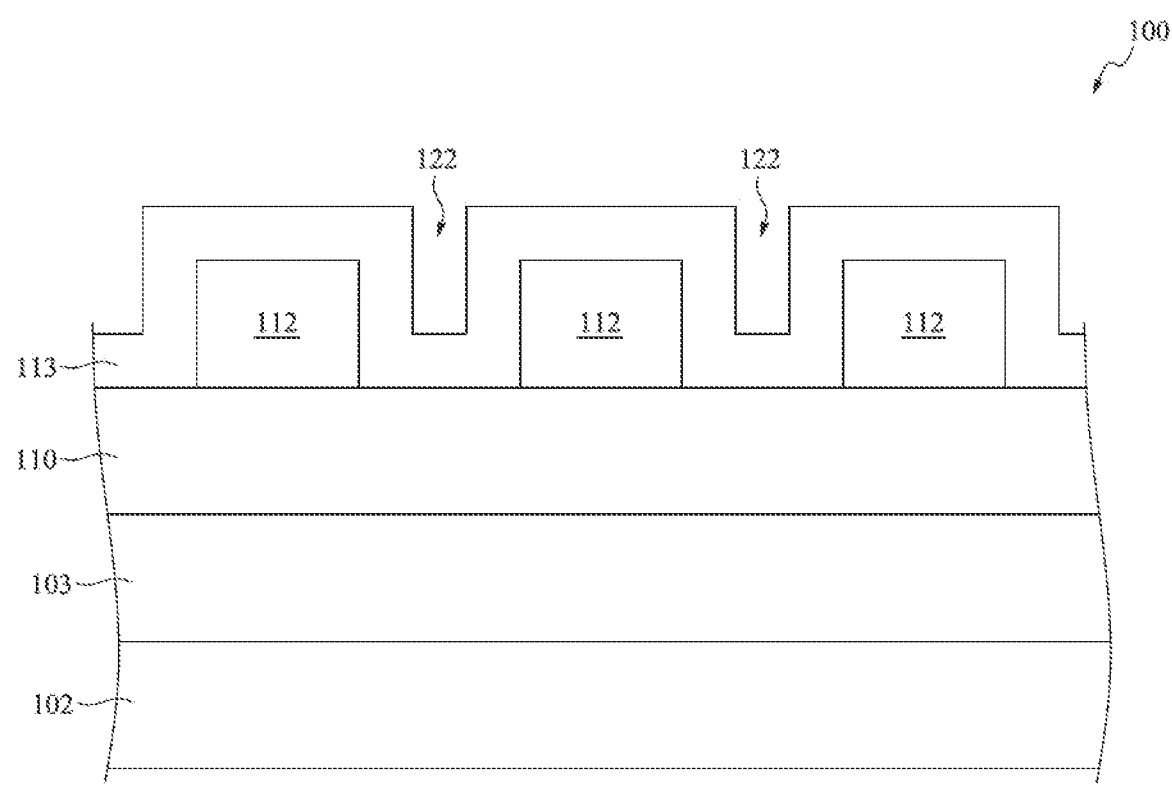
Figure 4B:
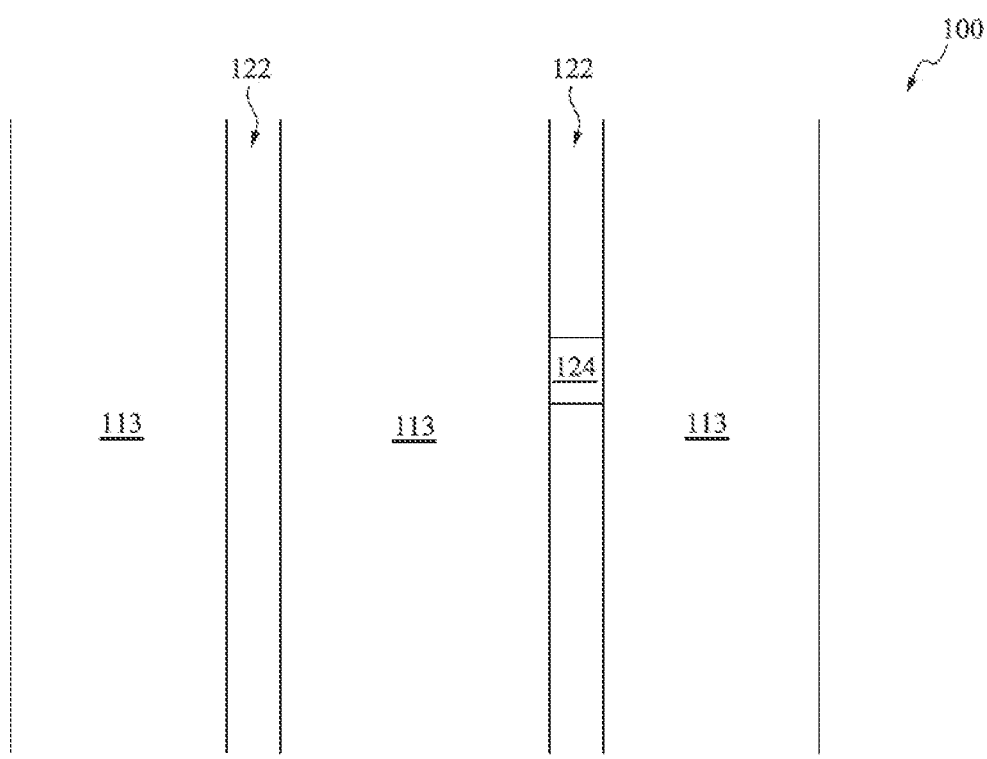

FIG. 4A is a cross-sectional view of an integrated circuit 100 at an intermediate stage of processing, according to one embodiment. FIG. 4B is a top view of the integrated circuit 100 of FIG. 4A, according to one embodiment. In the views of FIGS. 4A and 4B, the top layer 120, the middle layer 118, and the bottom layer 116 have been removed by one or more etching processes as described above. The organic dielectric material 124 that was deposited in the trench 121 remains, as can be seen in the top view of FIG. 4B. The position of the remaining organic dielectric material 124 corresponds to the position of a break in the signal line 106D. While only a single break position as shown in FIGS. 4A and 4B, in practice, the positions of multiple breaks in the signal line 106D, as well as in the signal line 106A, can be formed by forming multiple trenches 121 and filling them with the inorganic dielectric material 124 (or other materials, in other embodiments) as described in relation to FIGS. 3A and 3B. The process for marking the positions of the breaks in the signal lines 106A and 106D as described in relation to FIGS. 3A-4B can be utilized to form breaks in the signal lines 106B and 106C, as will be described in more detail below.

Figure 5A:
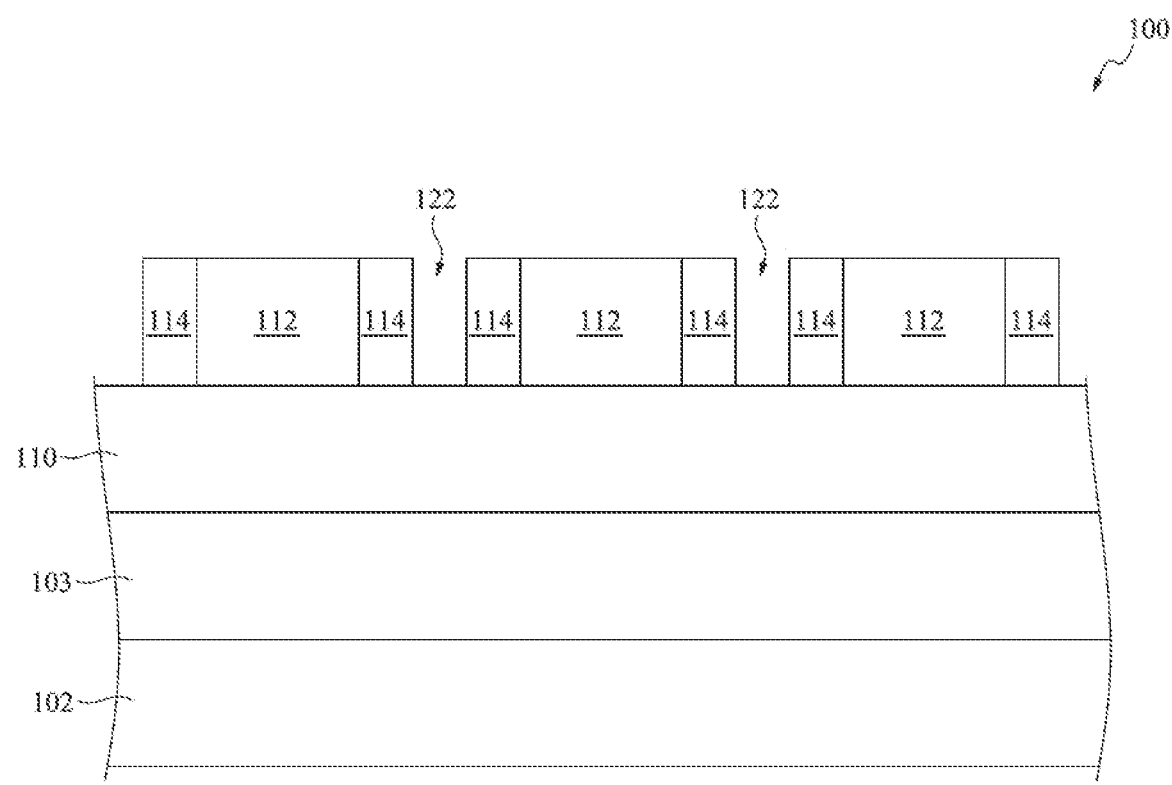

FIG. 5A is a cross-sectional view of the integrated circuit 100 and an intermediate stage of processing, according to one embodiment. In FIG. 5A, the first spacer layer 113 has been partially removed. The first spacer layer 113 can be partially removed by a timed, anisotropic etching process. The anisotropic etch etches selectively in the downward direction. Thus, the anisotropic etch does not significantly etch the first spacer layer 113 in the horizontal direction. The etch is timed to remove a vertical thickness of the first spacer layer 113 corresponding to a thickness of the first spacer layer 113 on top of the mandrels 112 and in the thinner areas between the mandrels 112, but not significantly more. The result is that the first spacer layer 113 remains on the sidewalls of the mandrels 112, but is removed from the top of the mandrels 112 and the openings 122, leaving a portion of the second hard mask layer 110 exposed. First spacers 114 correspond to the remaining portions of the first spacer layer 113. The time anisotropic etch selectively etches the material of the first spacer layer 114 with respect to the inorganic dielectric material 124 (or other material) utilized for patterning breaks in the signal lines 106A and 106D.

Figure 5B:
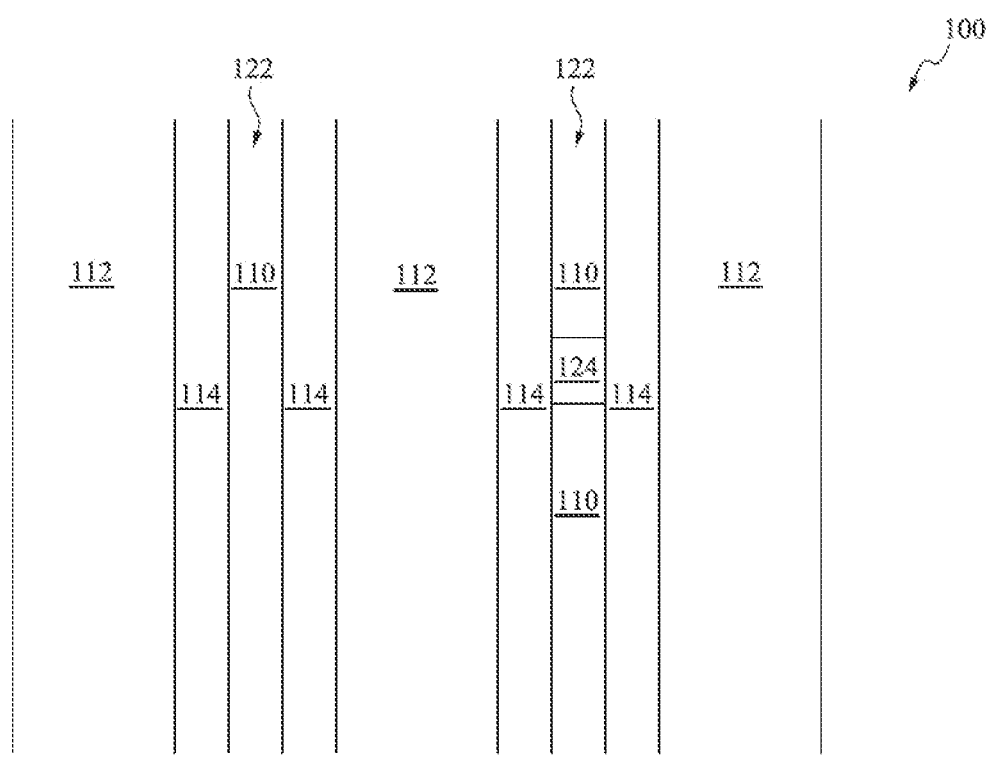

FIG. 5B is a top view of the integrated circuit 100 of FIG. 5A, according to one embodiment. The tops of the mandrels 112 are exposed. The tops of the first spacers 114 covering the sidewalls of the mandrels 112 are exposed. The top surface of the second mask layer 110 is exposed in the openings 122. The organic dielectric material 124 marking the position of a break in the signal line 106D is also exposed.

Figure 6A:
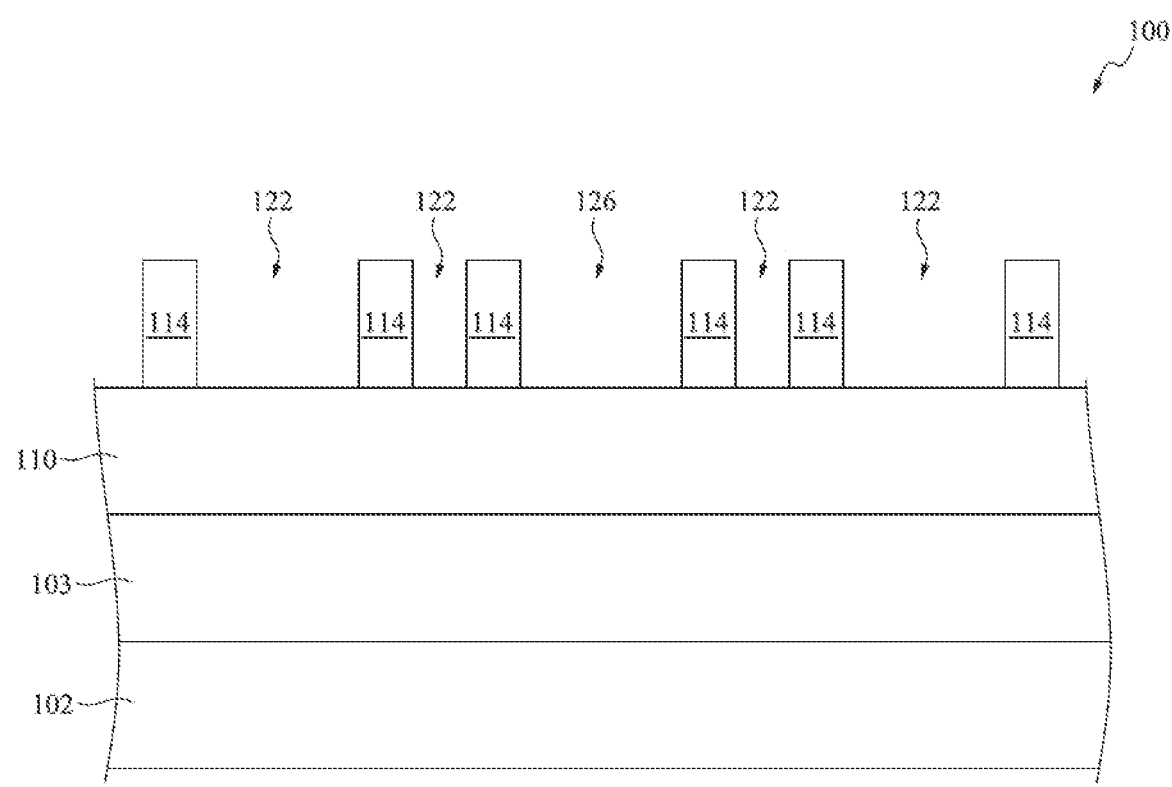

FIG. 6A is a cross-sectional view of the integrated circuit 100 at an intermediate stage of processing, according to one embodiment. In FIG. 6A, the mandrels 112 have been removed by one or more etching processes. The one or more etching processes can include a dry etch, a wet etch, a combination of wet and dry etches, or other etching processes. The one or more etching processes selectively etch the material of the mandrels 112 with respect to the material of the first spacers 114. Accordingly, after the removal of the mandrels 112, the first spacers 114 covering the sidewalls of the mandrels 112 remain on the surface of the second hard mask layer 110. The top surface of the second hard mask layer 110 is exposed in the openings 122 where the mandrels 112 used to be.

Figure 6B:
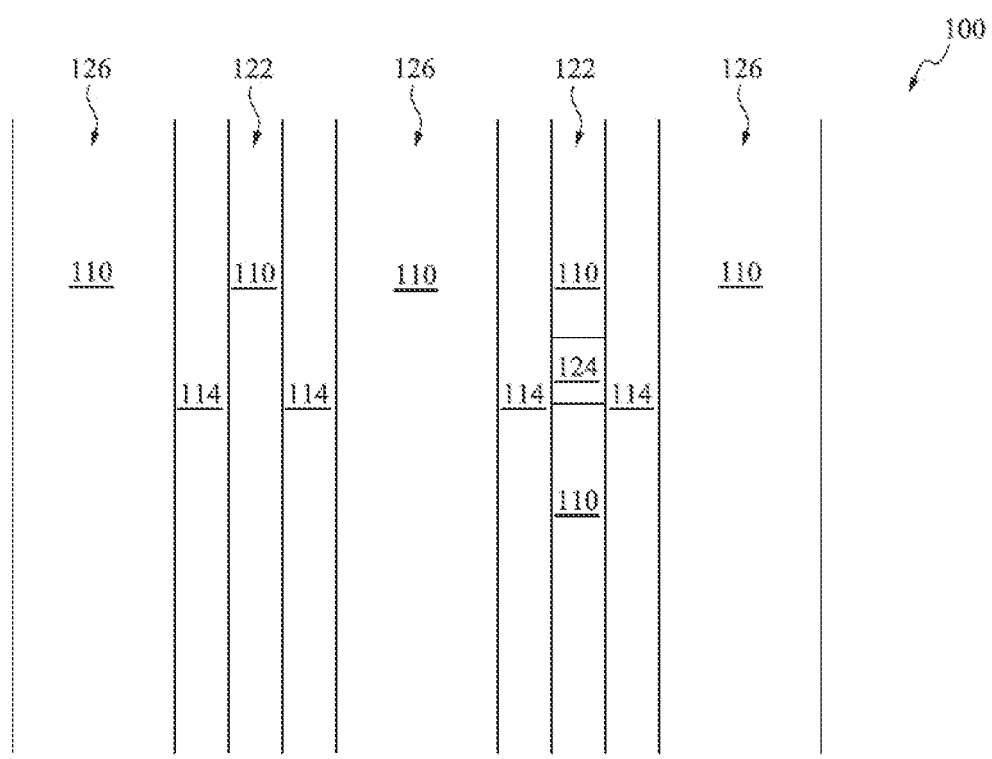

FIG. 6B is a top view of the integrated circuit 100 of FIG. 6A, according to one embodiment. In the view of FIG. 6A, the top surface of the second hard mask 110 is exposed to the openings 126 and 122. The openings (or gaps or trenches) 122 define a pattern for the first and second supply tracks 104A and 104B and the signal lines 106A and 106D.

Figure 7A:
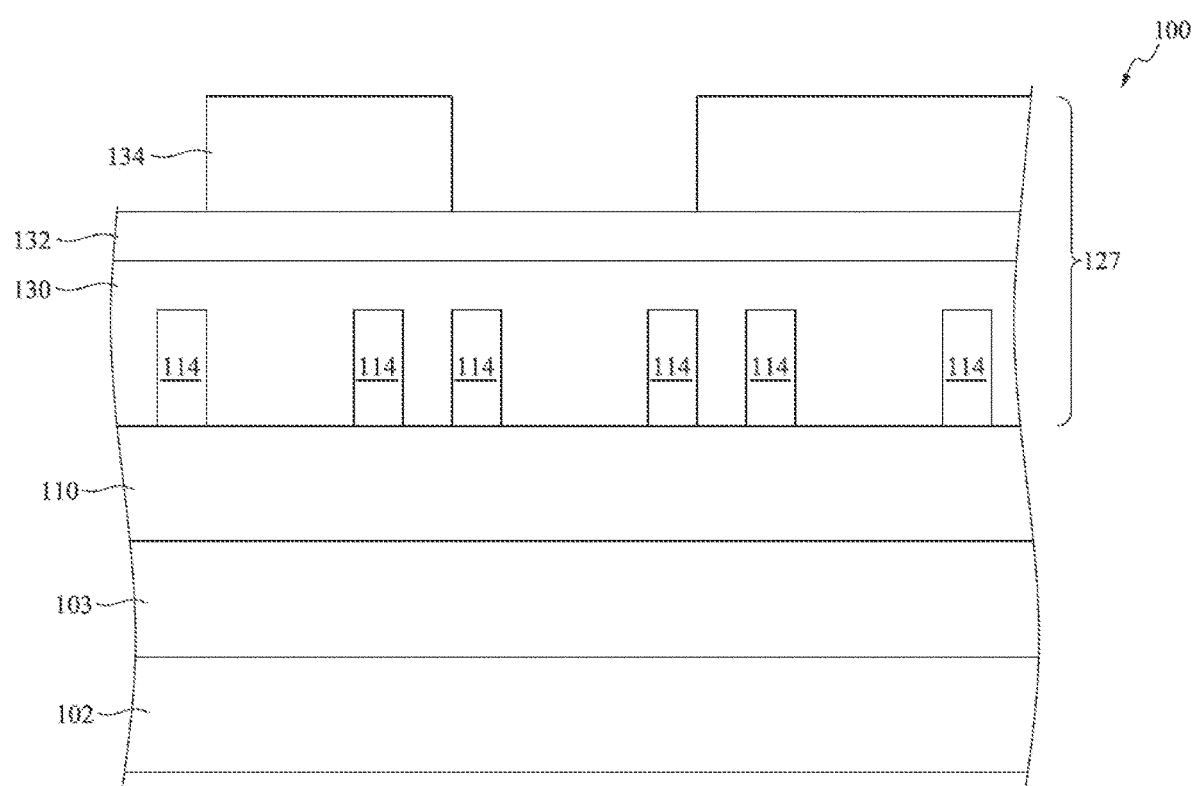

FIG. 7A is a cross-sectional view of the integrated circuit 100, according to one embodiment. In FIG. 7A, a mask stack 127 is formed on the exposed portions of the second hard mask layer 110, the first spacers 114, and the inorganic material 124 (or other material). The mass stack 127 includes a bottom layer 130, a middle layer 132, and a top layer 134. The materials and thicknesses of the bottom layer 130, the middle layer 132, and the top layer 134 can respectively be the same as the materials and thicknesses of the bottom layer 116, the middle layer 118, and the top layer 120 of the mask stack 115. Alternatively, the materials, thicknesses, and deposition processes for the mass stack 127 can be different from for the mask stack 115.

In FIG. 7A, the top layer 134 of the mask stack 127 has been patterned by irradiation through a mask. In one embodiment, the top layer 134 is patterned with a 193 nm immersion (193i) photolithography process. Alternatively, the top layer 134 can be patterned through other standard photolithography techniques without departing from the scope of the present disclosure. Portions of the middle layer 132 of the mask stack 127 are exposed.

Figure 7B:
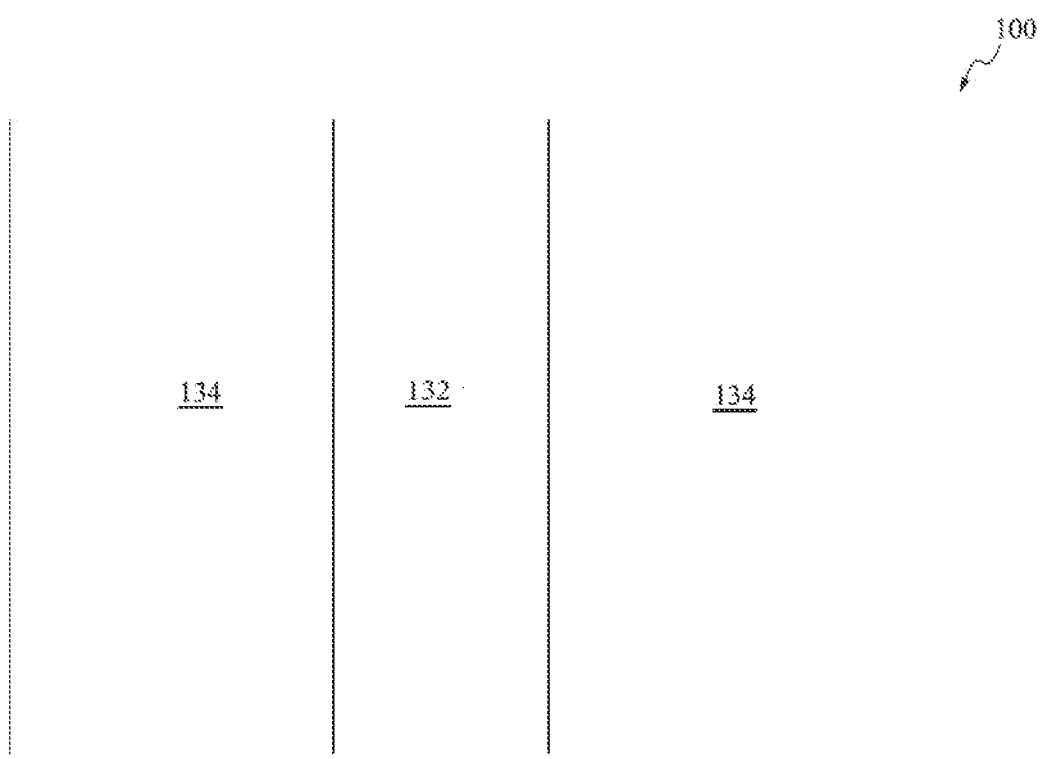

FIG. 7B is a top view of the integrated circuit 100 of FIG. 7A, according to one embodiment. The view of FIG. 7B illustrates the exposed portions of the top layer 134 and the middle layer 132 of the mask stack 127.

Figure 7C:
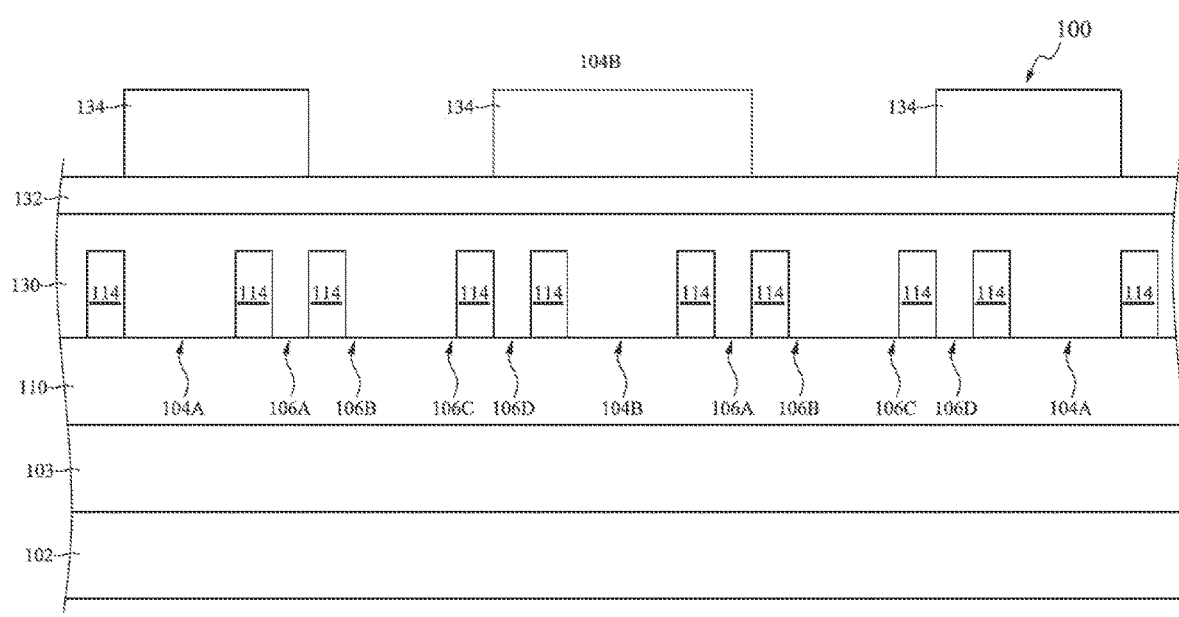

FIG. 7C is a zoomed-out cross-sectional view of the integrated circuit of FIG. 7A, according to one embodiment. The view of FIG. 7C illustrates how multiple unit cells may be patterned at once. In particular, the view of FIG. 7C illustrates how the top layer 134 is patterned across multiple unit cells. The pattern of the top layer 134 will be used as a starting point to form the pattern for the signal lines 106B and 106C. FIG. 7C includes indicators showing the horizontal positions at which the supply tracks 104A and 104B and the signal lines 106A-106D will be formed for two unit cells, though the actual supply tracks 104A and 104B will be formed at a vertically lower position on the substrate 102. FIG. 7C also illustrates how each supply track 104A or 104B will be shared by two adjacent unit cells. The ensuing figures will revert to the closer view of FIGS. 1A-7B for simplicity.

Figure 8A:
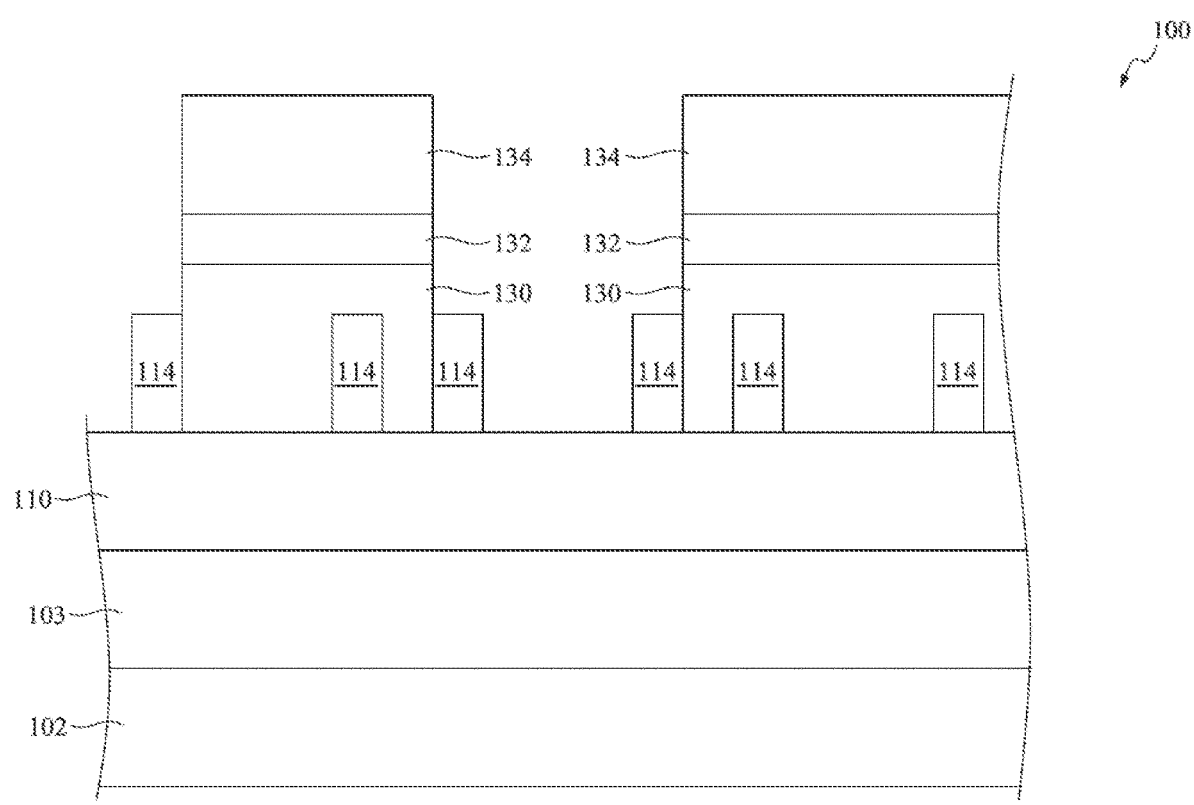

FIG. 8A is a cross-sectional view of an integrated circuit 100 at an intermediate stage of processing, according to one embodiment. In FIG. 8A, the bottom layer 130 and the middle layer 132 heaven etched using one or more etching processes. The one or more etching processes are anisotropic etching processes that selectively etch in the downward direction. The top layer 134 is used as a mask to etch the bottom layer 130 and the middle layer 132. The one or more etching processes selectively etch the material of the bottom layer 130 and material of the middle layer 132 with respect to the material of the first spacers 114 and the second hard mask layer 110. The result of this etching process is that portions of the first spacers 114 and portions of the second hard mask layer 110 are exposed.

Figure 8B:
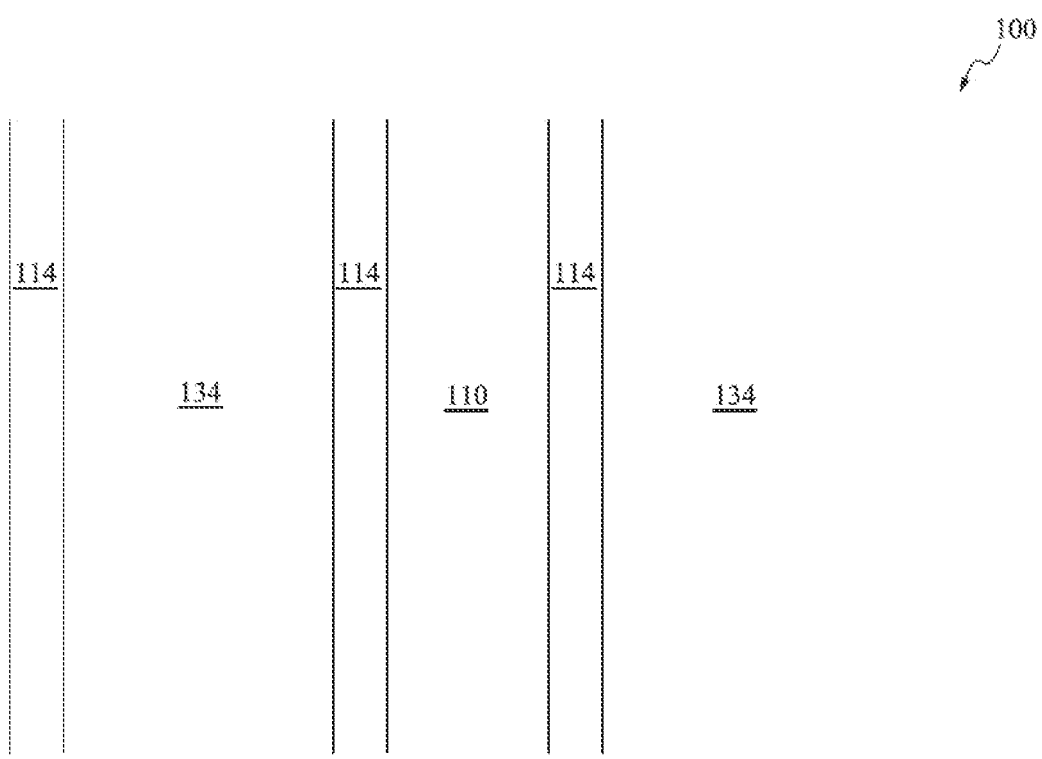

FIG. 8B is a top view of the integrated circuit 100 of FIG. 8A, according to one embodiment. The view of FIG. 8B illustrates the exposed portions of the top layer 134, the first spacers 114, and the second hard mask layer 110.

Figure 9A:
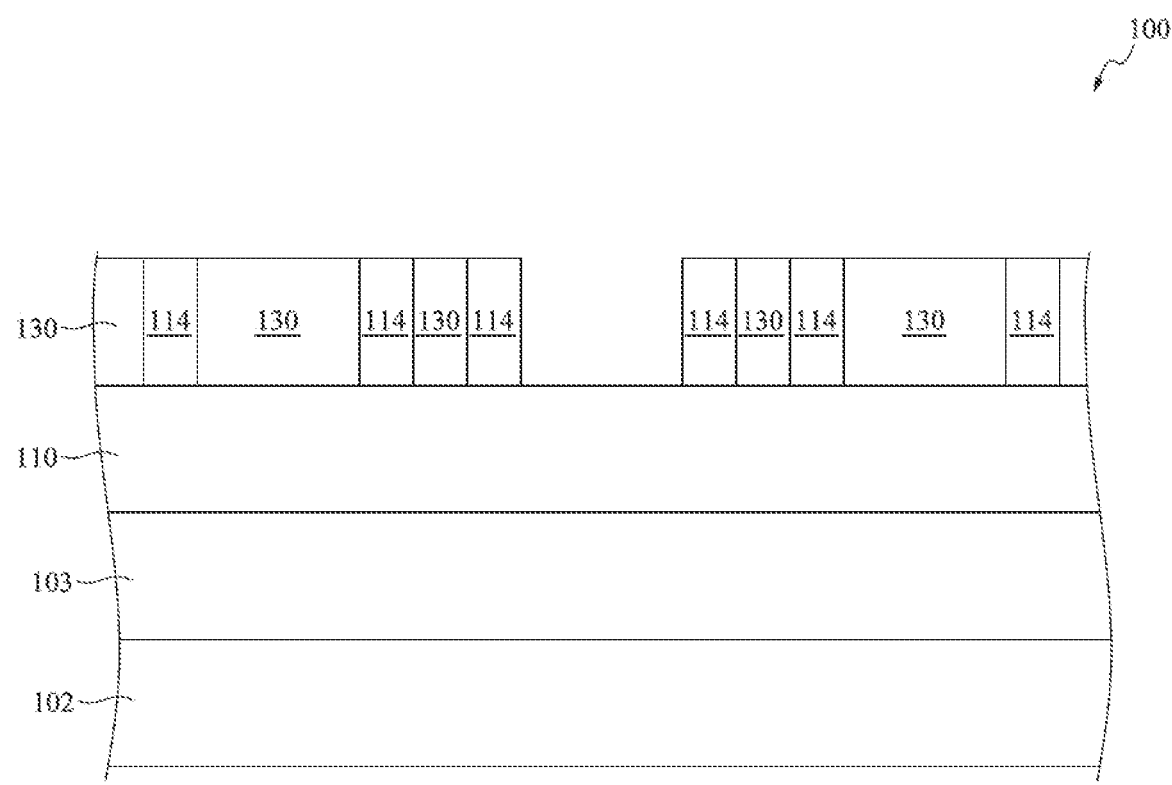

FIG. 9A is a cross-sectional view of the integrated circuit 100 at an intermediate stage of processing, according to one embodiment. In FIG. 9A, one or more etching processes has been performed to remove the top layer 134 and the middle layer 132. The etching processes can include one or more dry etches, one or more wet etches, a combination of wet and dry etches, or other etching processes.

After removal top layer 134 and the middle layer 132, the bottom layer 130 is etched back using one or more etching processes. The etching processes etch the bottom layer 130 to a same height as the first spacers 114. The etching processes can include one or more wet etches, one or more dry etches, a combination of wet and dry etches, or other etching processes. In one embodiment, the etching processes include a timed etch that removes a selected thickness of the bottom layer 130 based on the known etching rate of the etching process in the amount of time selected for the etching process. Other etching processes can be utilized without departing from the scope of the present disclosure.

Figure 9B:
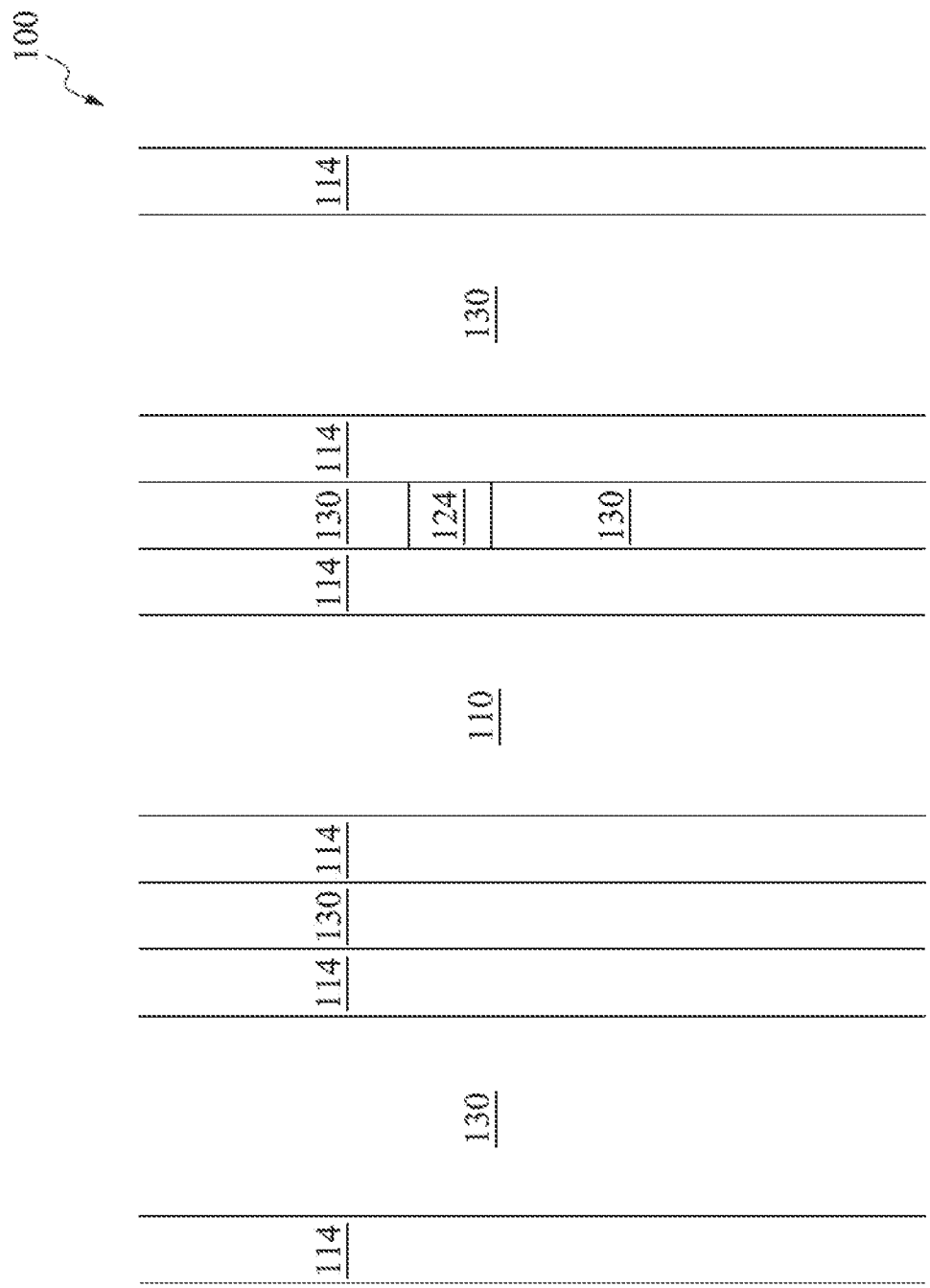

FIG. 9B is a top view of the integrated circuit 100 of FIG. 9A, according to one embodiment. The view of FIG. 9B illustrates the exposed portions of the first spacers 114, the bottom layer 130, the second hard mask layer 110, and the organic dielectric layer 124 (or other material).

The process described in relation to FIGS. 2A-9B corresponds to a process for forming the patterns for the supply tracks 104A and 104B as well as the signal lines 106A and 106D. In particular, as will be described in more detail below, the supply tracks 104A and 104B and the signal lines 106A and 106D will be formed at locations on the substrate 102 corresponding to the remaining portions of the bottom layer 130 in FIGS. 9A and 9B. Additionally, the process described in relation to FIGS. 2A-9B provides a set up for the eventual patterning of the signal lines 106B and 106C. The signal lines 106B and 106C will be located at locations on the substrate 102 corresponding to the exposed portion of the second hard mask 110 in FIGS. 9A and 9B.

FIGS. 10A-15B illustrate a first process for completing formation of the supply tracks 104A and 104B and the signal lines 106A-106D, according to one embodiment. FIGS. 16A-21 illustrate a second process for completing formation of the supply tracks 104A and 104B and the signal lines 106A-106D, according to one embodiment. FIGS. 22-27 illustrate a third process for completing formation of the supply tracks 104A and 104B and the signal lines 106A-106D, according to one embodiment.

Figure 10A:
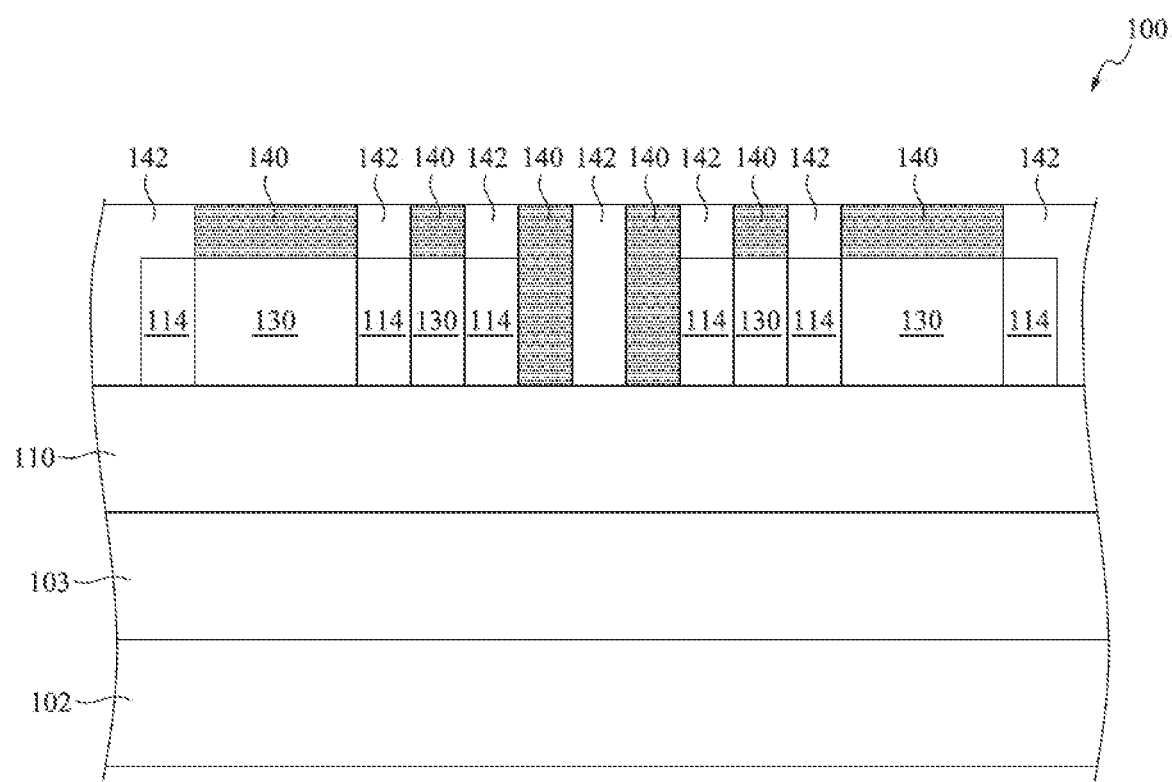

FIG. 10A is a cross-sectional view of an integrated circuit 100 at an intermediate stage of processing, according to one embodiment. In FIG. 10A a directed self-assembly (DSA) polymer has been deposited on the exposed areas of the integrated circuit 100. In particular, the DSA polymer covers the exposed portions of the bottom layer 130, the first spacers 114, and the second hard mask layer 110. The DSA polymer can be deposited in liquid form via a spin on process. Other deposition processes can be utilized for the DSA polymer without departing from the scope of the present disclosure.

In one embodiment, the DSA polymer self assembles into two different polymer materials. The two different polymer materials will self assemble at respective locations of the integrated circuit 100 based on the exposed materials of those locations. In one example, the DSA material self assembles into a first polymer material 140 and a second polymer material 142 in the manner shown in FIG. 10A. In one example, the first polymer material 140 is polymethyl methacrylate (PMMA) and the second polymer material 142 is polystyrene. Other materials can be utilized for the directed self-assembly material without departing from the scope of the present disclosure.

In one embodiment, the notable feature of the self-assembly is that the first polymer material 140 self assembles on the exposed side walls of the first spacers 114 and on corresponding locations of the exposed portions of the second hard mask 110. The second polymer material self assembles on the exposed portion of the second hard mask layer 110 that is not adjacent to the exposed side walls of the first spacer layer 140. As will be described in more detail below, the self-assembly characteristic assists in forming the pattern for the signal lines 106B and 106C.

Figure 10B:
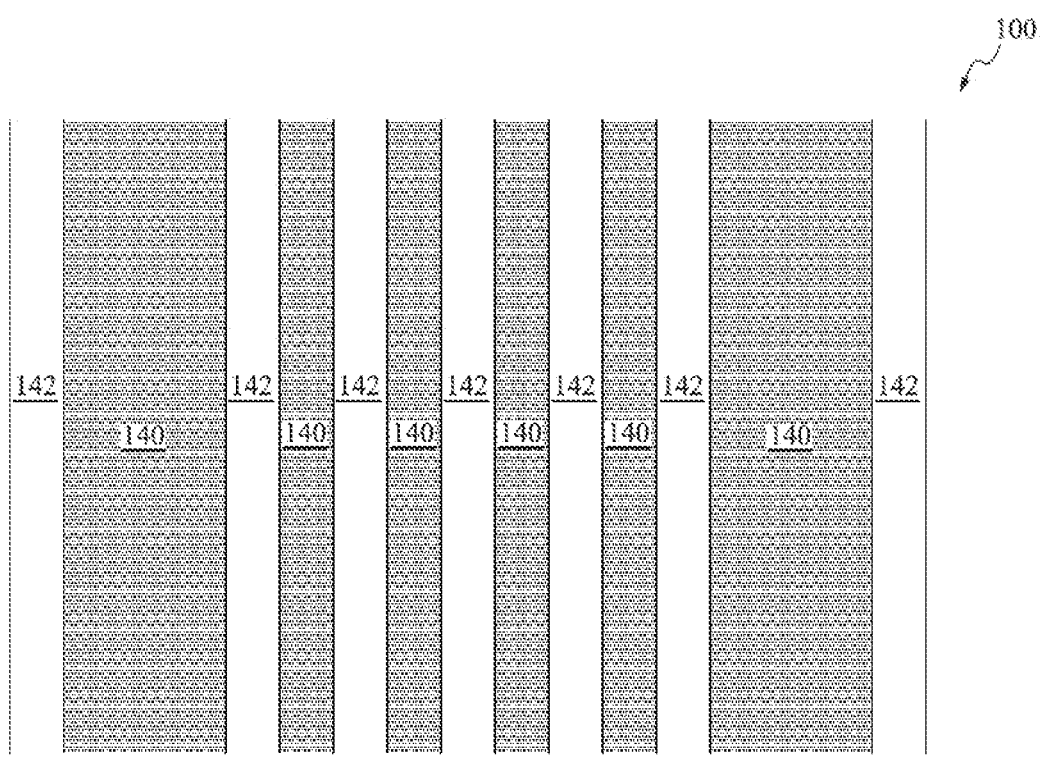

FIG. 10B is a top view of the integrated circuit 100 of FIG. 10A. The view of FIG. 10B illustrates the locations of the self assembled first polymer material 140 and second polymer material 142. In practice, the self-assembly of the first and second polymer materials may be less even than is shown in FIGS. 10A and 10B on the exposed top surfaces of the bottom layer 130 and the first spacers 114. However, as noted above, one desired feature of the self-assembly is that the first polymer material 140 forms on the exposed side walls of the first spacers 114 and the second polymer material 142 forms in the gap between portions of the first polymer material 140 that formed on the exposed side walls of the first spacer material 114. Another desired feature of the first and second polymer materials of the DSA material is that the first and second polymer materials can be selectively etched with respect to each other.

Figure 11A:
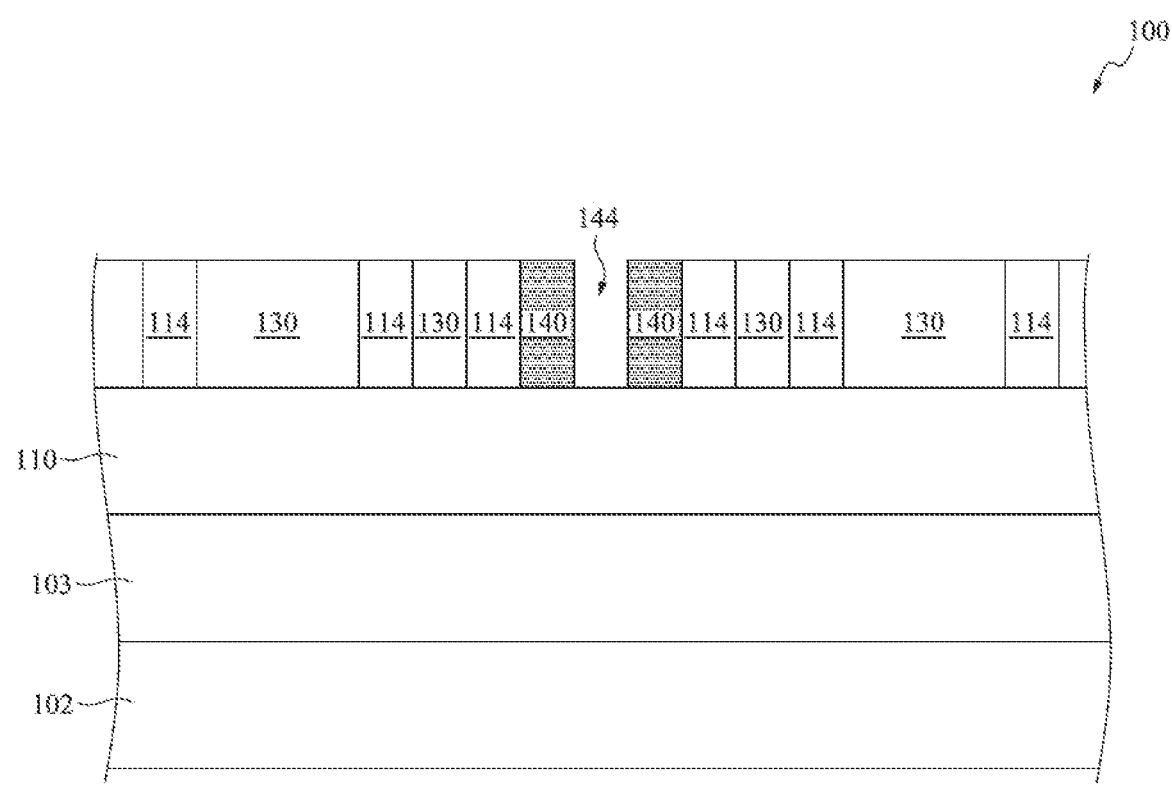

FIG. 11A is a cross-sectional view of the integrated circuit 100 at an intermediate stage of processing, according to one embodiment. In the view of FIG. 11A, an etching process has been performed to remove the second polymer material 142. The etching process can include one or more dry etches, one or more wet etches, or other etching processes. After the second polymer material is been removed, the first polymer material is etched back to approximately the same height as the first spacers 114 and the bottom layer 130. The etching process can include one or more of a timed etch, a dry etch, a wet etch, a planarization process, or other types of etch back processes. The result of the etching processes is that a gap 144 is positioned between remaining portions of the first polymer material 140. The second hard mask layer 110 is exposed in the gap.

Figure 11B:
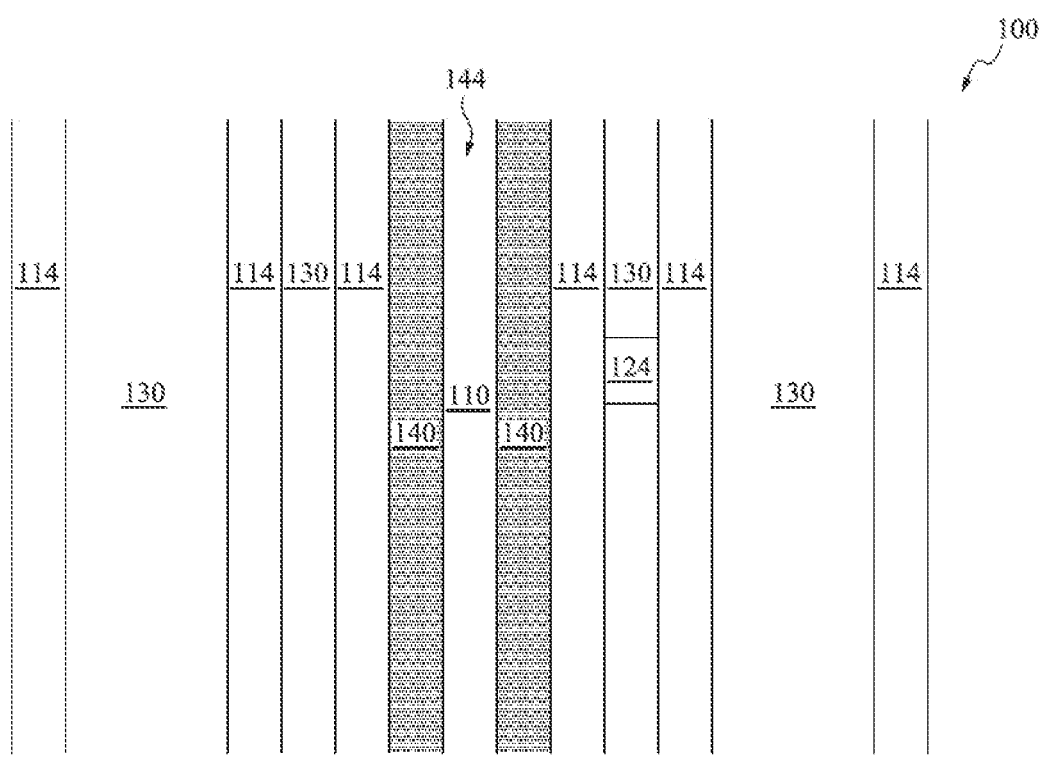

FIG. 11B is a top view of the integrated circuit 100 of FIG. 11A, according to one embodiment. The top view of FIG. 11B illustrates the top surfaces of the first spacers 114, the bottom layer 130, the first polymer material 140, and the second hard mask layer 110.

Figure 12:
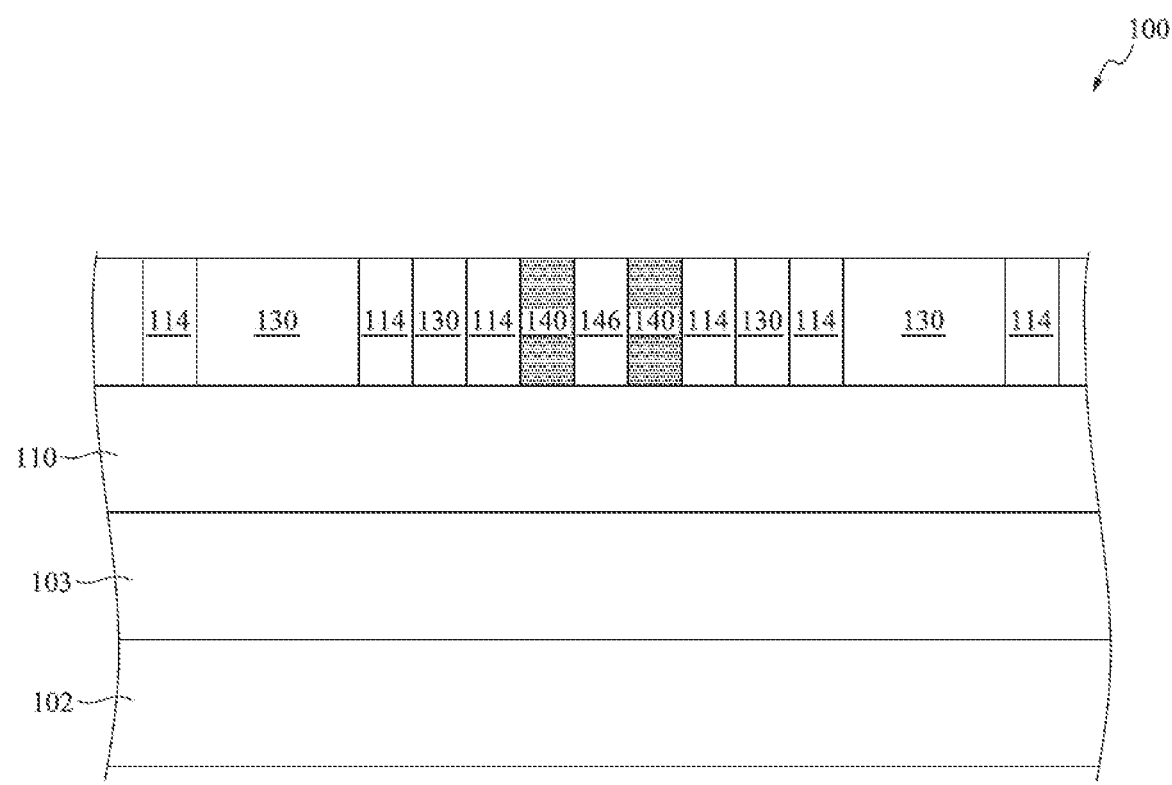

FIG. 12 is a top view of the integrated circuit 100 at an intermediate stage of processing, according to one embodiment. In FIG. 12 a second spacer layer has been deposited on the exposed surfaces of the integrated circuit 100 and, more particularly, in the gap 144 between the remaining portions of the first polymer material 140. After deposition of the second spacer layer, the second spacer layer is subject to an etch back process to remove the second spacer layer from the top surfaces of the first polymer material 140, the first spacers 114, and the bottom layer 130. The result is that the second spacer 146 remains.

In one embodiment, the second spacer 146 is a material that is selectively etchable with respect to the first polymer material 140 and the bottom layer 130. The second spacer 146 can include a metal material, dielectric material, or ceramic material. In one example, the second spacer 146 is titanium oxide. In one embodiment, the second spacer 146 is the same material as the first spacers 114. Other materials can be utilized for the second spacer 146 without departing from the scope of the present disclosure.

In one embodiment, the second spacer layer can be deposited by one or more thin-film deposition processes. The thin-film deposition processes can include one or more of chemical vapor deposition, plasma enhanced chemical vapor deposition, physical vapor deposition, plasma enhanced physical vapor deposition, sputtering, atomic layer deposition, or other types of thin-film deposition processes. Thin-film deposition processes other than those described above can be utilized for the second spacer layer without departing from the scope of the present disclosure.

In one embodiment, after the second spacer 146 has been formed, the first polymer material 140 is removed by an etching process. The etching process selectively etches the first polymer care 140 with respect to the first spacers 114, the second spacer 146, the bottom layer 130, and the second hard mask layer 110.

Though not shown in FIGS. 10A-15B, after removal of the first polymer layer 140, but before final removal of the bottom layer 130, a process can be performed to pattern breaks in the signal lines 106B and 106C. The process can be the same process as was utilized to form the break in the signal line 106D, i.e., the remaining organic dielectric layer 124 (or other material) as shown and described in relation to FIGS. 3A-4B. In particular a mask stack of the same materials and properties as the mask stack 115 can be formed on the exposed portions of the integrated circuit 100. Trenches similar to the trench 121 can be formed corresponding to locations for the breaks in the signal lines 106B and 106C. An organic dielectric layer or other material can be deposited in the trenches and etched back, leaving organic dielectric layer 124 depositions selected for breaks in the signal lines as described in relation to FIGS. 3A-4B.

Figure 13:
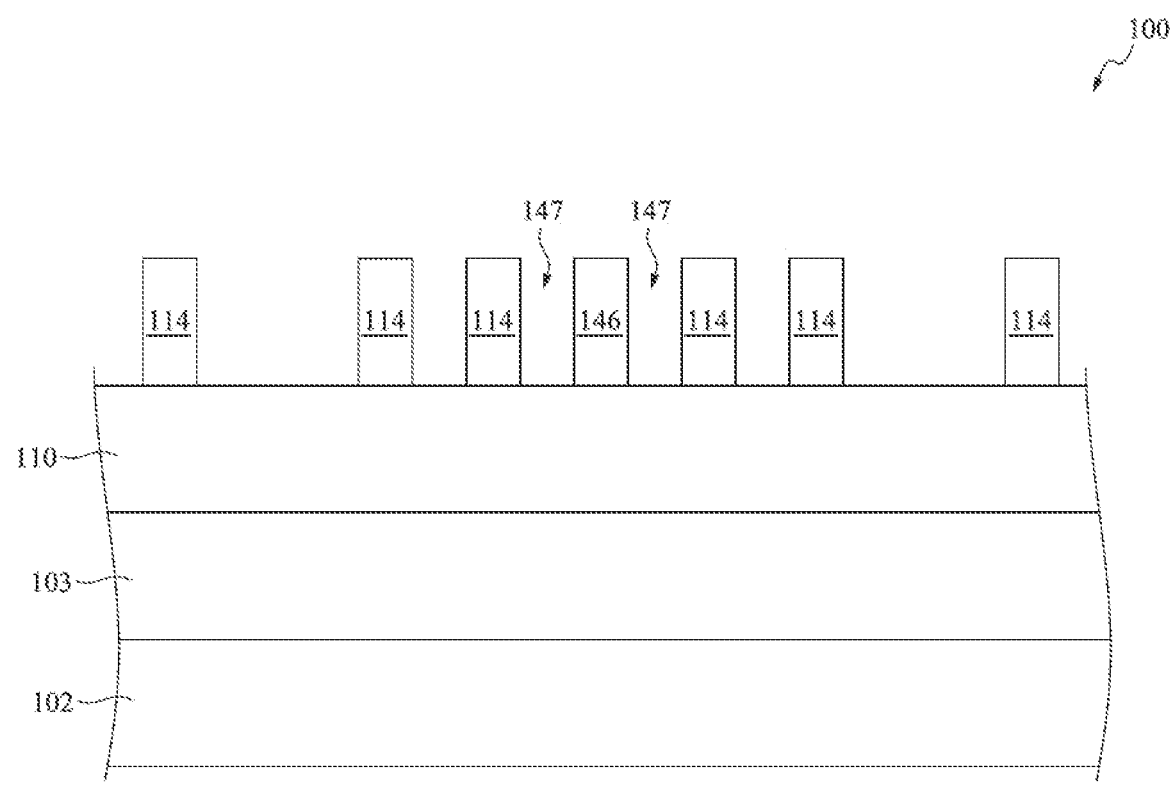

FIG. 13 is a cross-sectional view of the integrated circuit 100 at an intermediate stage of processing, according to one embodiment. In the view of FIG. 13, the first polymer material 140 and the bottom layer 130 have been removed via one or more etching processes, leaving openings (or gaps or trenches) 147 between the second spacer 146 and the first spacers 114. The first spacers 114 and the second spacer 146 remain on the second hard mask layer 110. Portions of the second hard mask layer 110 are exposed in accordance with the patterns of the first spacers 114 and the second spacer 146. The openings 147 between the second spacer 146 and the adjacent first spacers 114 define a pattern for the signal lines 106B and 106C. The widths of the remaining portions of the first spacers 114 and the second spacer 146 correspond to the critical dimensions of the unit cell, i.e., the distances between adjacent supply tracks and signal lines. These critical dimensions have, advantageously, been formed with photolithography processes having resolutions far larger than the critical dimensions.

Figure 14:
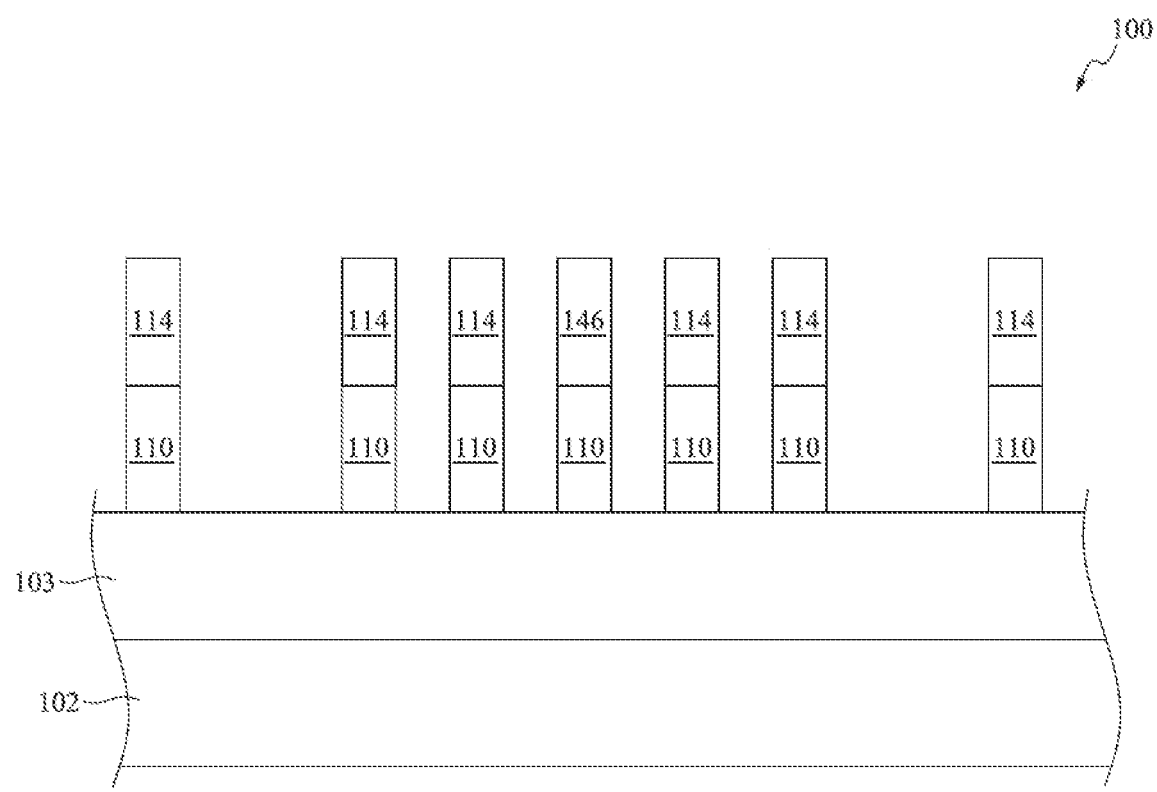

FIG. 14 is a cross-sectional view of the integrated circuit 100 at an intermediate stage of processing, according to one embodiment. In FIG. 14, one or more etching processes have been performed to etch the exposed portions of the second hard mask layer 110. The one or more etching processes selectively etch the second hard mask layer 110 with respect to the first spacers 114 and the second spacer 146.

Figure 15A:
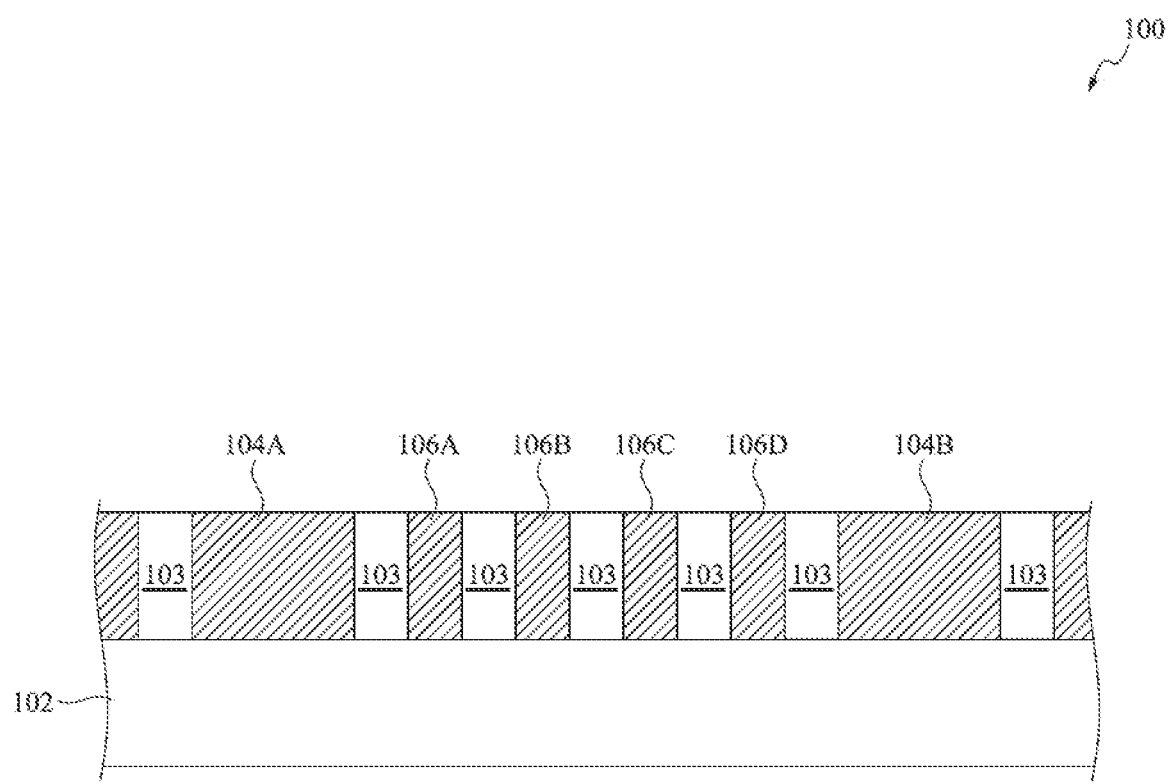

FIG. 15A is a cross-sectional view of the integrated circuit 100 at an intermediate stage of processing, according to one embodiment. In FIG. 15A, exposed portions of the first hard mask layer 103 have been etched using one or more etching processes that selectively etch the first hard mask layer 103 with respect to the second hard mask layer 110. The first spacers 114, the second spacer 146, and the second hard mask layer 110 were then removed using one or more etching processes.

In one embodiment, supply tracks 104A and 104B, and signal lines 106A-106D are formed by depositing a conductive material on the integrated circuit 100. The material for the supply tracks 104A, 104B, 106A-106D can be deposited by one or more thin-film deposition processes. The thin-film deposition processes can include one or more of chemical vapor deposition, plasma enhanced chemical vapor deposition, physical vapor deposition, plasma enhanced physical vapor deposition, sputtering, atomic layer deposition, or other types of thin-film deposition processes. Thin-film deposition processes other than those described above can be utilized for the material of the supply tracks 104A and 104B, and signal lines 106A-106D without departing from the scope of the present disclosure. After deposition of the material for the supply tracks 104A and 104B and signal lines 106A-106D, an etch back and planarization process is performed to generate the supply tracks 104A and 104B, and signal lines 106A-106D as shown in FIG. 15A.

Figure 15B:
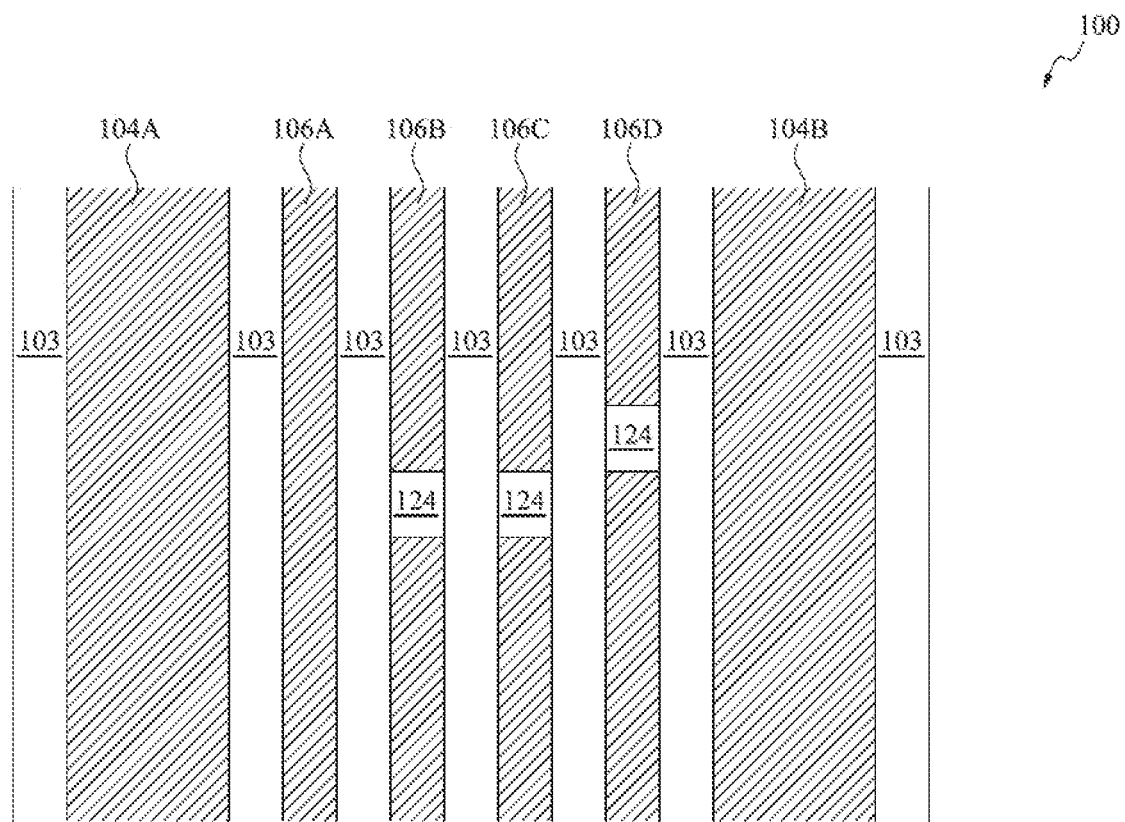

FIG. 15B is a top view of the integrated circuit 100 of FIG. 15A, according to one embodiment. The top view of FIG. 15A illustrates how the supply tracks 104A and 104B, and signal lines 106A-106D extend across integrated circuit 100. FIG. 15B also illustrates breaks in the signal lines 106B-106D.

In one embodiment, the supply tracks 104A and 104B and signal lines 106A-106D, as shown in FIGS. 1A and 1B, can be obtained by removing the remaining portions of the first hard mask layer 103. The remaining portions of the first hard mask layer 103 can be removed via one or more etching processes including one or more wet etches, one or more dry etches, or other types of etching processes.

FIGS. 16A-21 illustrated a second process for obtaining the supply tracks 104A and 104B, and signal lines 106A-106D of FIGS. 1A and 1B starting from the structure shown in FIGS. 9A and 9B, according to one embodiment.

Figure 16A:
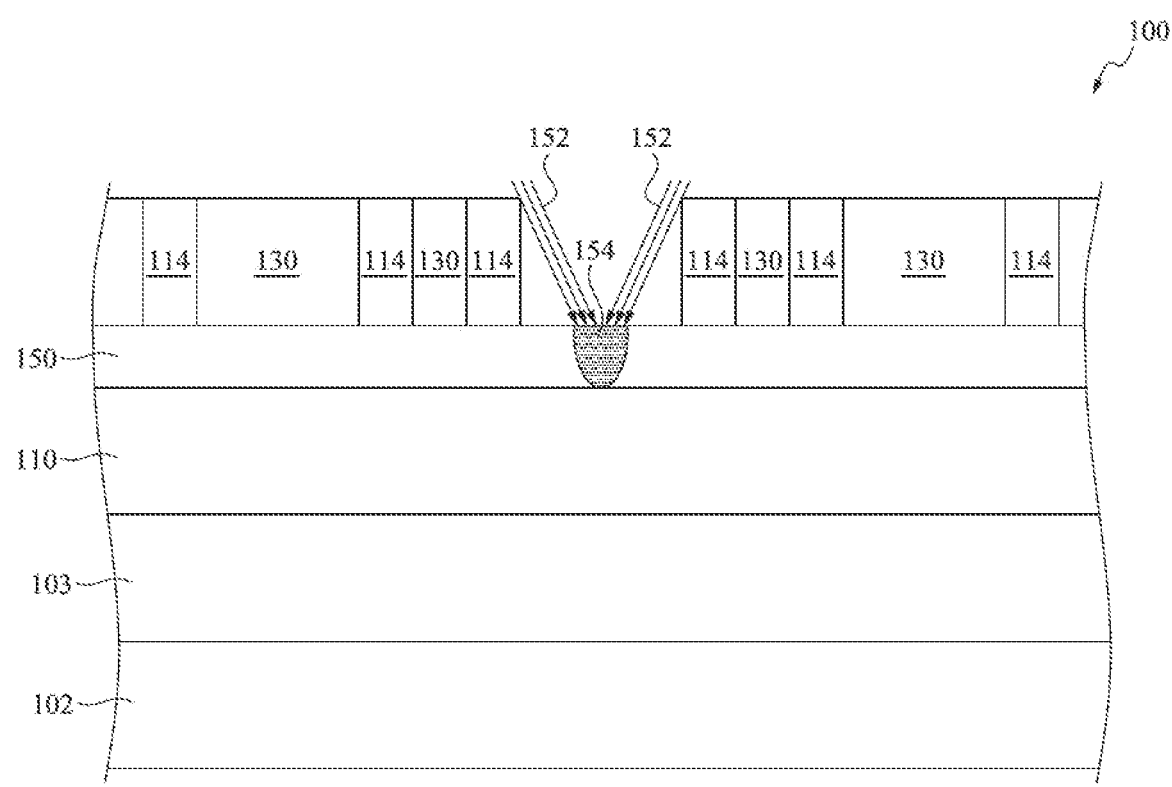

FIG. 16A is a cross-sectional view of the integrated circuit 100, according to one embodiment. The embodiment of FIG. 16A assumes one adjustment to the process of FIGS. 2A-9B. In particular, prior to forming the mandrels 112, a layer of dielectric material 150 is deposited. The layer of dielectric material 150 can include one or more of silicon oxide, silicon nitride, or other types of dielectric layers. The layer of dielectric material 150 can have a thickness between 10 nm and 500 nm. The layer of dielectric material can be deposited by one or more thin-film processes such as those described previously. The layer of dielectric material 150 can include materials, thicknesses, and deposition processes other than those described above without departing from the scope of the present disclosure. FIG. 16A assumes that the first spacer 114 and the bottom layer 130 have been formed as described in relation to FIG. 9B.

In one embodiment, dopant species 152 are implanted in the integrated circuit 100 via one or more dopant implantation processes. For example, the dopants 152 can be implanted via an ion implantation process in which ions bombard the integrated circuit 100 at two different angles. The angles of the ion implantation are selected so that a center area of the exposed portion of the layer of dielectric material 150 receives dopant ions from both angles while other exposed portions of the layer of dielectric material 150 receive dopant ions only from one of the angles. The result is the formation of a heavily doped region 154 in the layer of dielectric material 150. The heavily doped region 154 is heavily doped in comparison to the exposed areas of the layer of dielectric material 150 adjacent to the heavily doped region 154.

In one embodiment, the dopant species include boron. Alternatively, the dopant species can include dopants other than boron without departing from the scope of the present disclosure. In one embodiment, the dopant concentration in the heavily doped region 154 is between $10^7$ cm$^{-3}$ and $10^{10}$ cm$^{-3}$. Other dopant concentrations can be utilized without departing from the scope of the present disclosure.

Figure 16B:
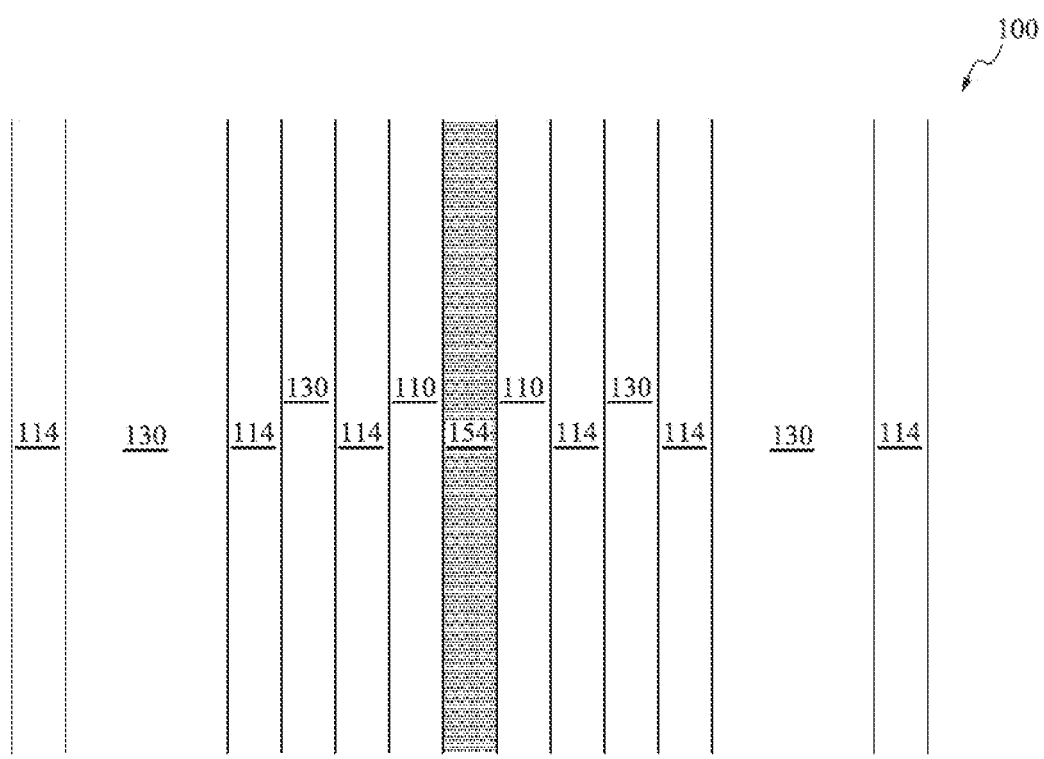

FIG. 16B is a top view of the integrated circuit 100 FIG. 16A, according to an embodiment. The top view of FIG.

16A illustrates the heavily doped region 154 extending the same direction as the first spacers 114.

Figure 17:
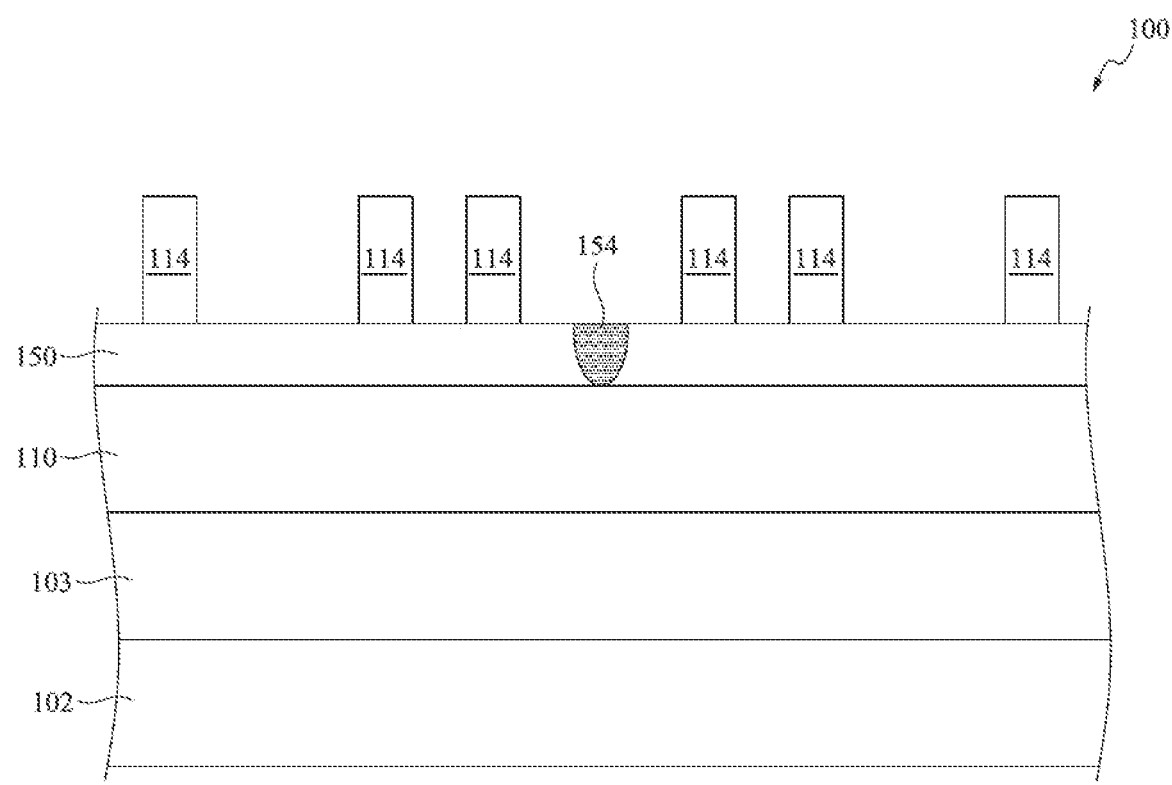

FIG. 17 is a cross-sectional view of the integrated circuit 100 at an intermediate stage of processing, according to one embodiment. In FIG. 17, the bottom layer 130 has been removed via one or more etching processes. The one or more etching processes selectively etch the bottom layer 130 with respect to the layer of dielectric material 150 and the first spacers 114. The one or more etching processes can include one or more of a dry etch, a wet etch, a combination of wet and dry etching, or other etching processes.

Figure 18:
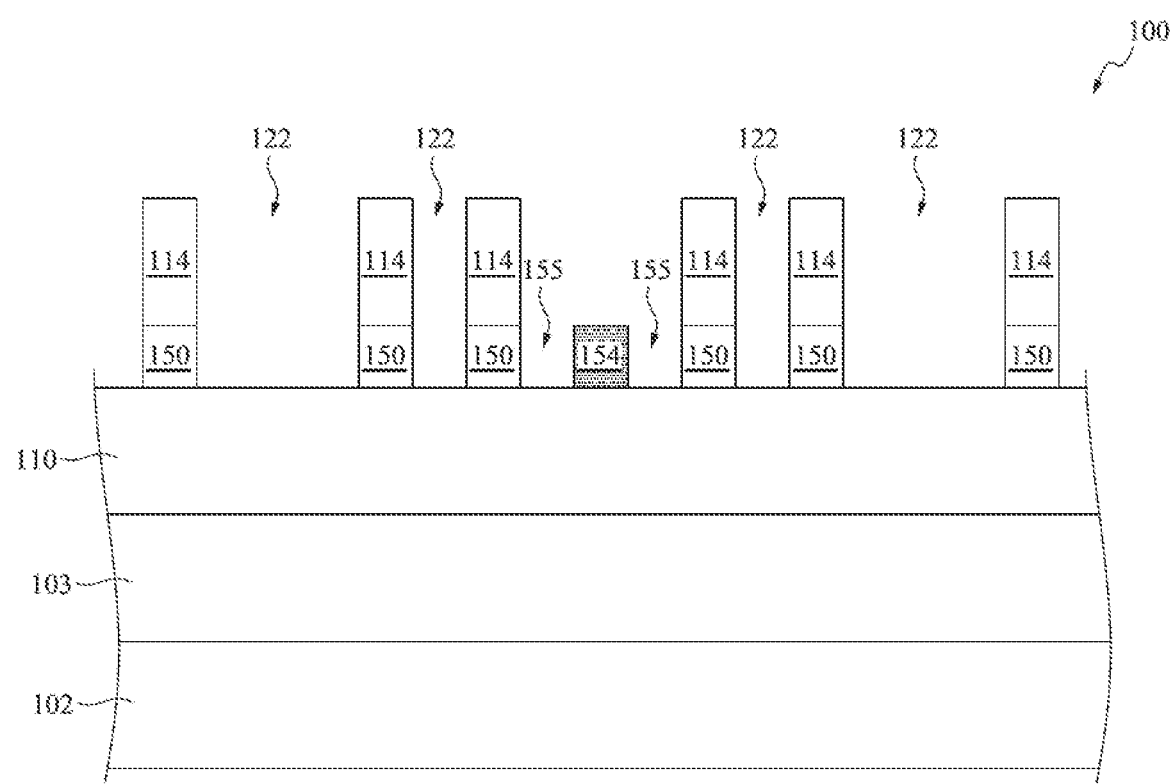

FIG. 18 is a cross-sectional view of the integrated circuit 100 at an intermediate stage of processing, according to one embodiment. In FIG. 18, the layer of dielectric material 150 has been etched via an etching process. The etching process selectively etches the undoped or lightly doped portions of the layer of dielectric material 150 with respect to the heavily doped region 154. Accordingly, the heavily doped region 154 remains after the etching process etches the layer of dielectric material 150. The one or more etching processes are anisotropic etches that selectively etch in the downward direction.

The heavily doped region 154 defines a pattern for forming the signal lines 106B and 106C. In particular, the signal lines 106B and 106C will be formed at locations on the substrate 102 corresponding to the gaps between the remaining portion of the layer of dielectric material 150 and the heavily doped region 154. The etching of the layer of dielectric material 150 leaves openings or gaps 155 between the heavily doped region 154 and the adjacent first spacers 114.

Figure 19:

FIG. 19 is a cross-sectional view of the integrated circuit 100 at an intermediate stage of processing, according to one embodiment. In FIG. 19, the heavily doped region 154 and the first spacers 114 are used as a mask to etch the second hard mask layer 110 and the first hard mask layer 103. The first and second hard mask layers 103, 110 can be etched in successive etching processes. A first etching process may etch the exposed portions of the second hard mask layer 110. A second etching process may etch the exposed portions of the first hard mask layer 103.

In one embodiment, after etching the second hard mask layer 110, the first spacers 114, the layer of dielectric material 150, and the heavily doped region 154 may be removed via one or more etching processes. The exposed portions of the first hard mask layer 103 may then be etched using the second hard mask layer 110 is a mask.

Figure 20:
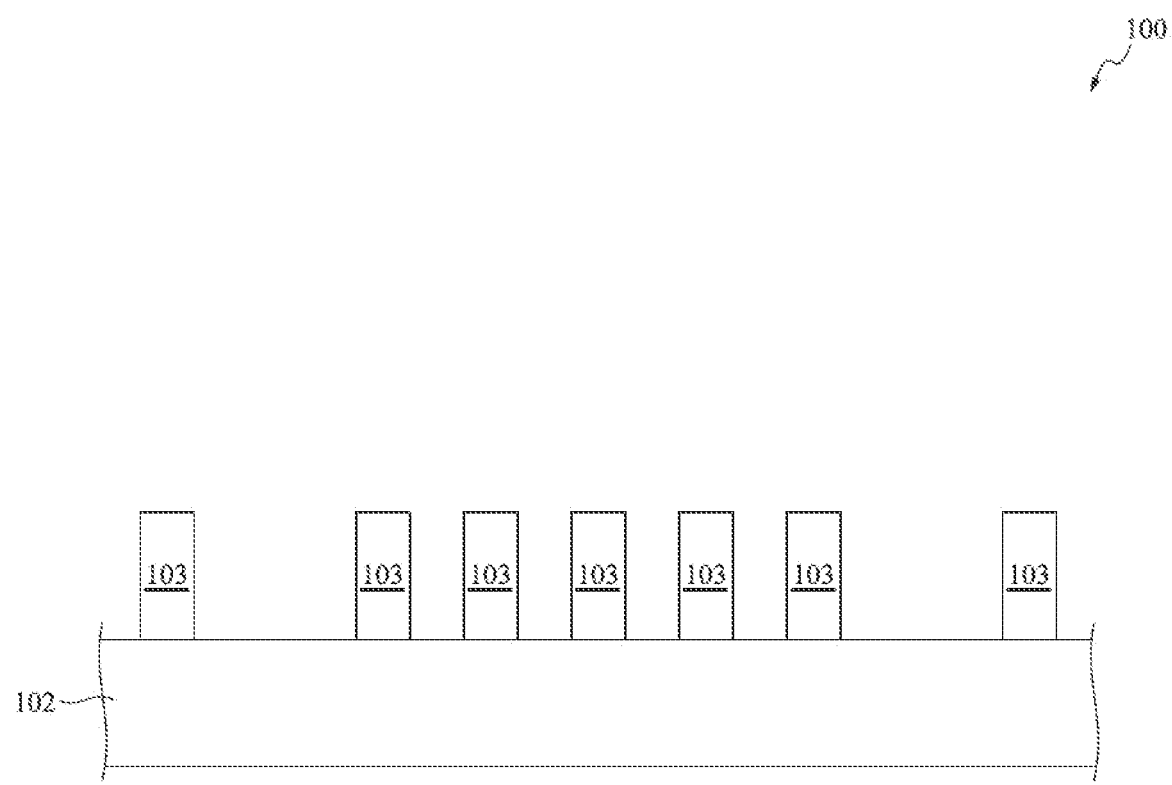

FIG. 20 is a cross-sectional view of an integrated circuit 100 at the intermediate stage of processing, according to one embodiment. In FIG. 20, the second hard mask layer 110 has been removed.

Figure 21:
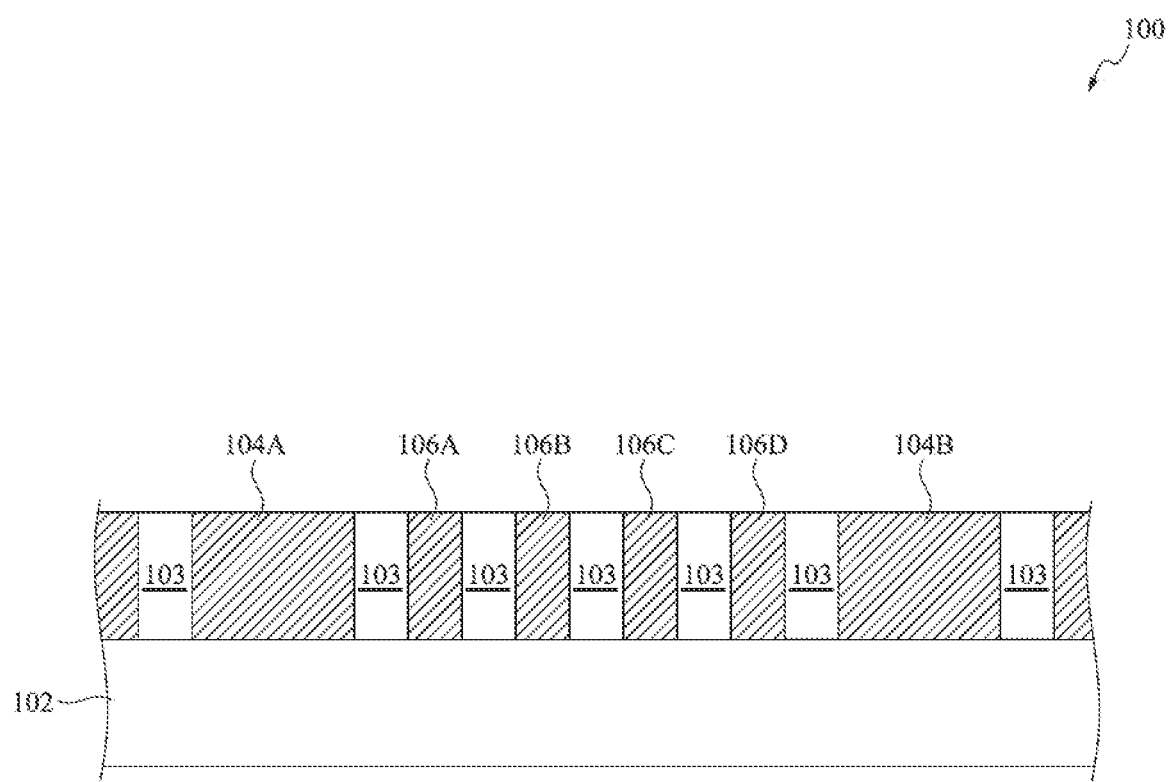

FIG. 21 is a cross-sectional diagram of the integrated circuit 100 of an intermediate stage of processing, according to one embodiment. A conductive material is deposited, etched, and planarized to form the supply tracks 104A and 104B, and signal lines 106A-106D between the remaining portions of the first hard mask layer 103 as described in relation to FIGS. 16A and 16B. From there, the first hard mask layer 103 can be removed to produce the unit cell structure of supply tracks 104A and 104B and signal lines 106A-106D shown in FIGS. 1A and 1B.

Though not shown in FIGS. 16A-21, after formation of the heavily doped region 154 and before etching of the layer of dielectric material 150, a process can be performed to pattern breaks in the signal lines 106B and 106C. The process can be the same process as was utilized to form the break in the signal line 106D, i.e., the remaining organic dielectric layer 124 (or other material) shown and described in relation to FIGS. 3A-4B. In particular, a mask stack of the same materials and properties as the mask stack 115 can be formed on the exposed portions of the integrated circuit 100. Trenches similar to the trench 121 can be formed corresponding to locations for the breaks in the signal lines 106B and 106C. An organic dielectric layer or other material can be deposited in the trenches and etched back, leaving organic dielectric layer 124 depositions selected to form breaks in the signal lines as described in relation to FIGS. 3A-4B.

FIGS. 22-27 illustrate a third process for completing formation of the supply tracks 104A and 104B and the signal lines 106A-106D, according to one embodiment.

Figure 22:
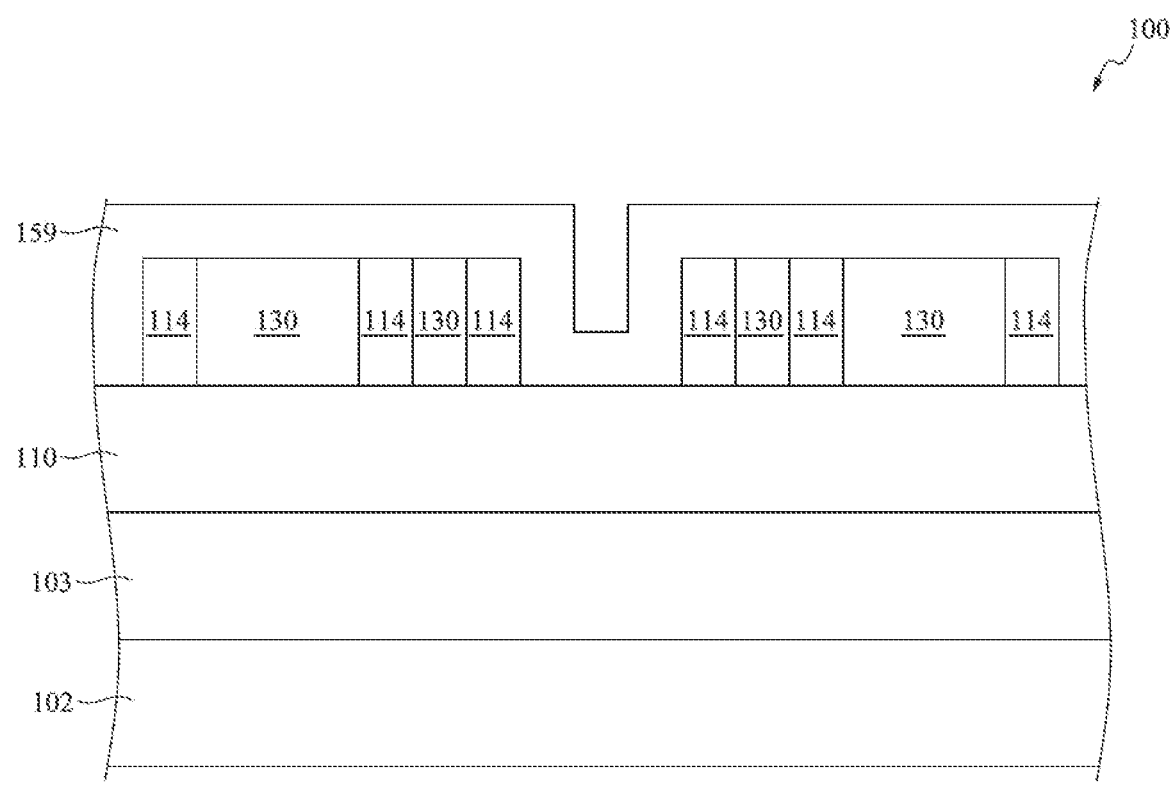

FIG. 22 is a cross-sectional view of the integrated circuit 100, according to one embodiment. Beginning from the structure shown in FIGS. 9A and 9B, a third spacer layer 159 is deposited on the exposed surfaces of the integrated circuit 100. The third spacer layer 159 has a thickness substantially equal to the thickness of the first spacers 114 as originally deposited. The third spacer layer 159 can be deposited by one or more thin-film deposition processes. The thin-film deposition processes can include one or more of chemical vapor deposition, plasma enhanced chemical vapor deposition, physical vapor deposition, plasma enhanced physical vapor deposition, sputtering, atomic layer deposition, or other types of thin-film deposition processes. Thin-film deposition processes other than those described above can be utilized for the third spacer layer 159 without departing from the scope of the present disclosure.

Figure 23:
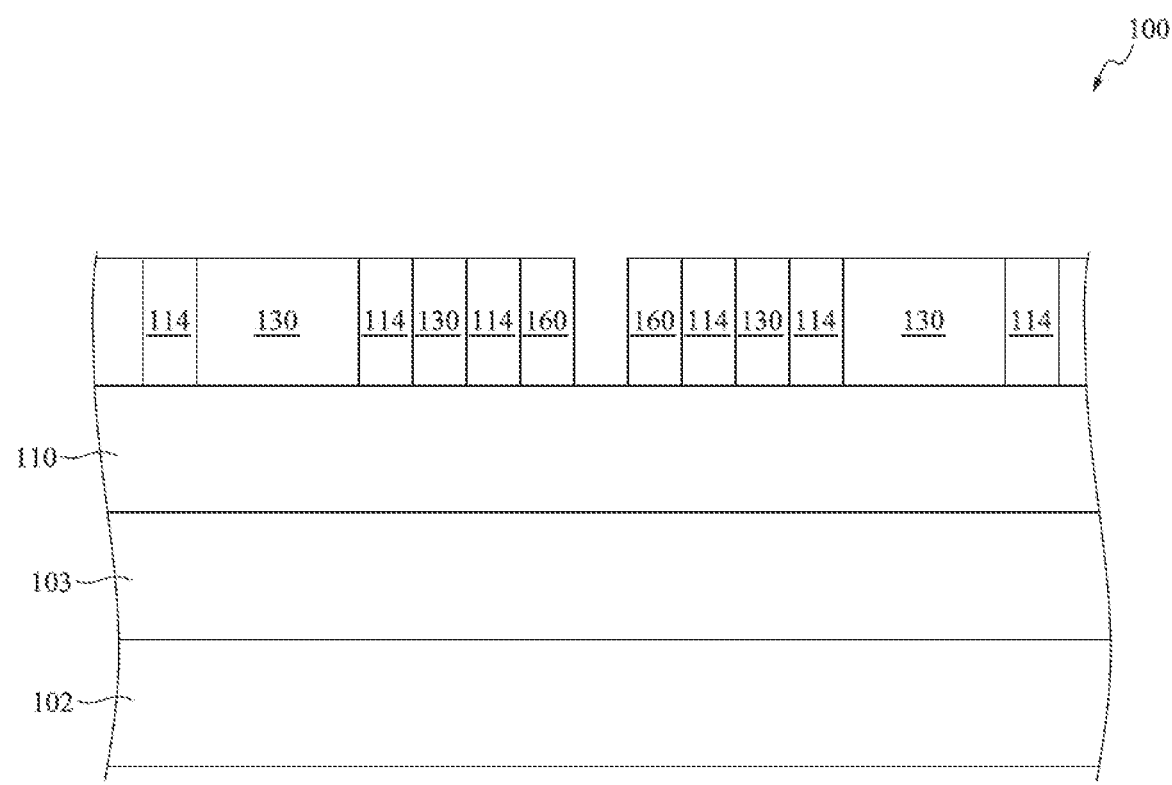

The third spacer layer 159 can include a metal, a dielectric material, or another type of material. The third spacer layer 159 includes a material that is selectively etchable with respect to the first spacers 114. In one example, the third spacer layer 159 includes ruthenium. Other materials, thicknesses, and deposition processes can be utilized for the third spacer layer 159 without departing from the scope of the present disclosure FIG. 23 is a cross-sectional view of an integrated circuit 100, according to one embodiment. In FIG. 23, the third spacer layer 159 has been subjected to a timed etch that etches a selected thickness of the third spacer layer 159. In particular, the third spacer layer is etched to remove the third spacer layer 159 from the top surfaces of the bottom layer 130, the first spacer layer 140, and the second hard mask layer 110. The third spacers 160 remains on the sidewalls of the first spacers 114 because of the increased thickness of the third spacer layer in that area. The timed etch does not entirely third spacer layer in these areas due to its increased thickness.

Figure 24:
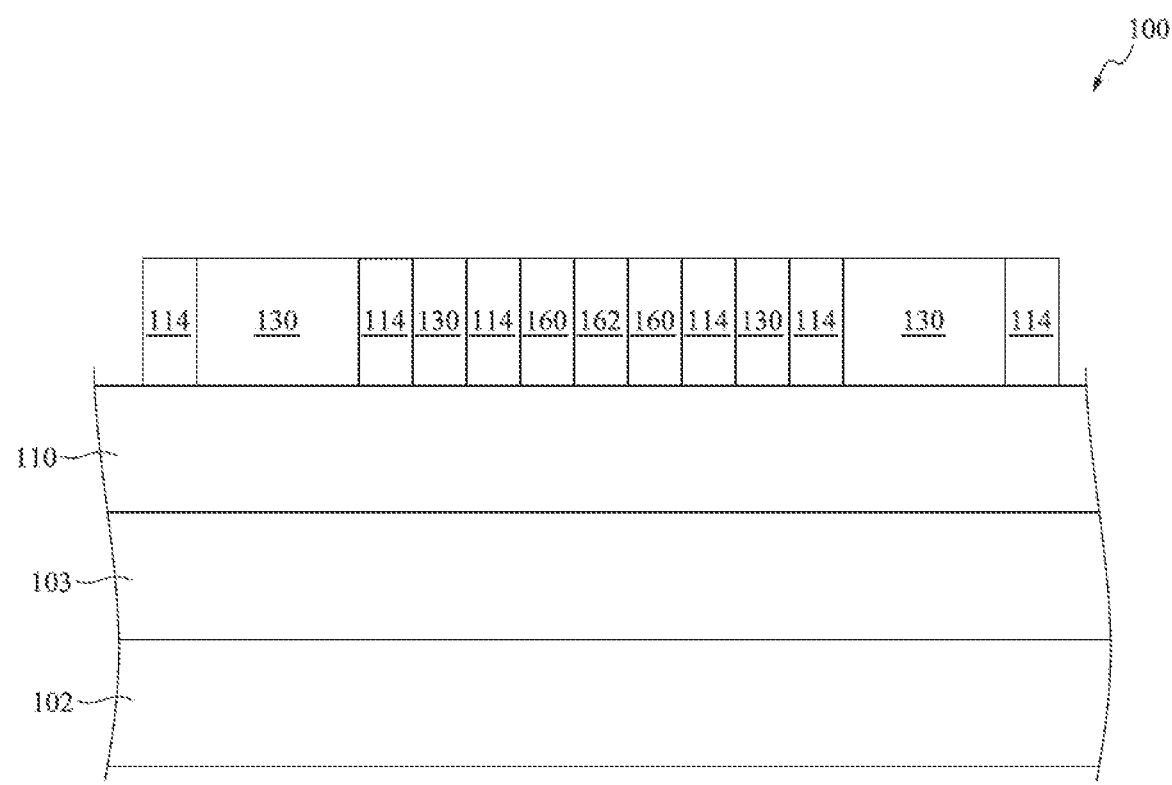

FIG. 24 is a cross-sectional view of an integrated circuit 100 at an intermediate stage of processing, according to one embodiment. A fourth spacer layer is deposited and etched back such that a fourth spacer 162 is positioned between the remaining portions of the third spacer layer 160 on the second hard mask layer 110. The fourth spacer layer can have a same material as the first spacers 114. The third spacer layer 160 is selectively etchable relative to the fourth spacer 162.

Figure 25:
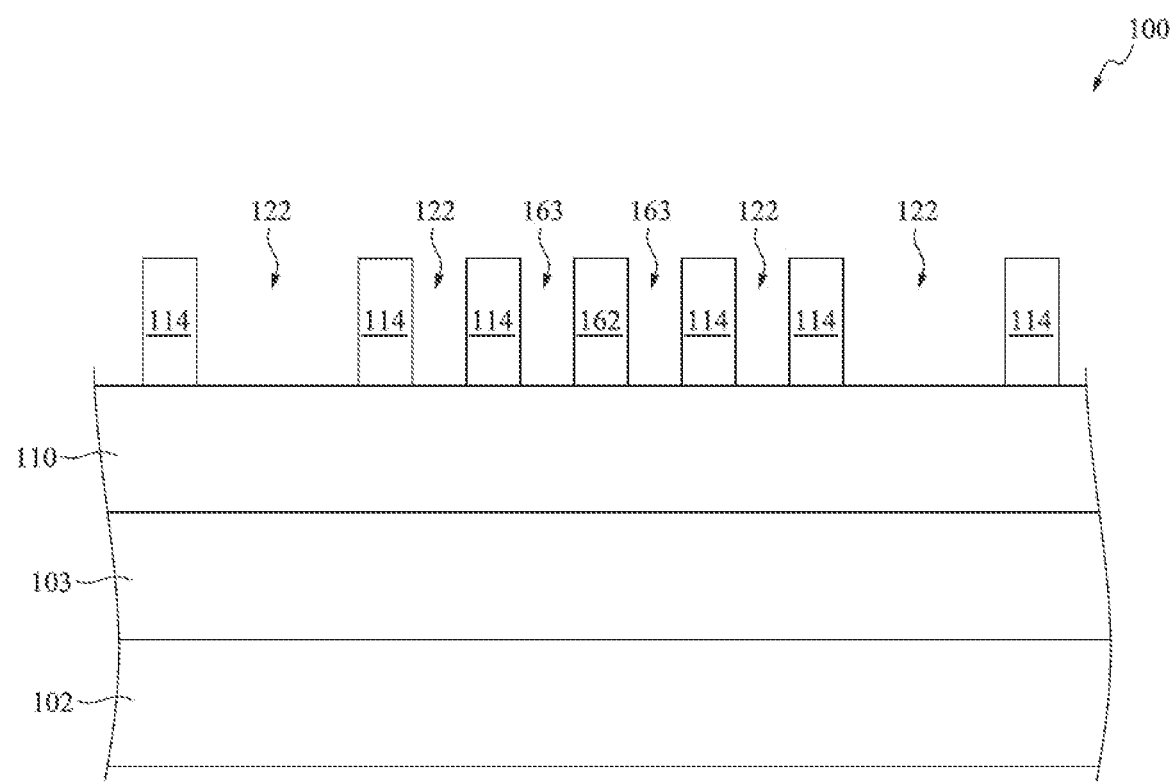

FIG. 25 is a cross-sectional view of an integrated circuit 100 at an intermediate stage of processing, according to one embodiment. In FIG. 25, the bottom layer 130 and the third spacer layer 160 have been removed via one or more etching processes. The fourth spacer 162 and the first spacers 114 remain, defining gaps 122 and 163 corresponding to a pattern for the first and second supply tracks 104A and 104B and the signal lines 106A-106D.

Figure 26:
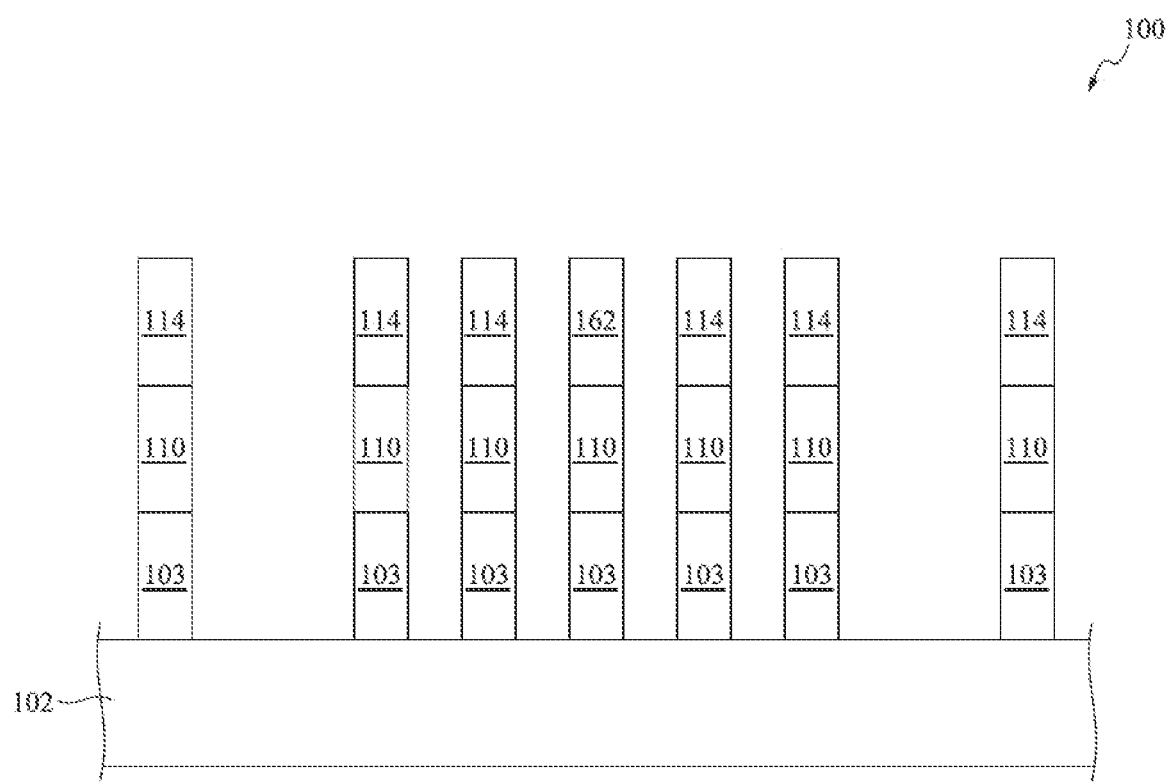

FIG. 26 is a cross-sectional view of an integrated circuit 100 at an intermediate stage of processing, according to one embodiment. The second hard mask layer 110 has been removed via one or more etching processes using the first spacers 114 of the fourth spacer 162 as a mask. The first hard mask layer 103 has been removed via one or more etching processes using the remaining portions of the first spacers 114 and the fourth spacer 162 as a mask. Alternatively, after etching the second hard mask layer 110, the first spacers 114 and the fourth spacer 162 can be removed prior to etching the first hard mask layer 103.

Figure 27:
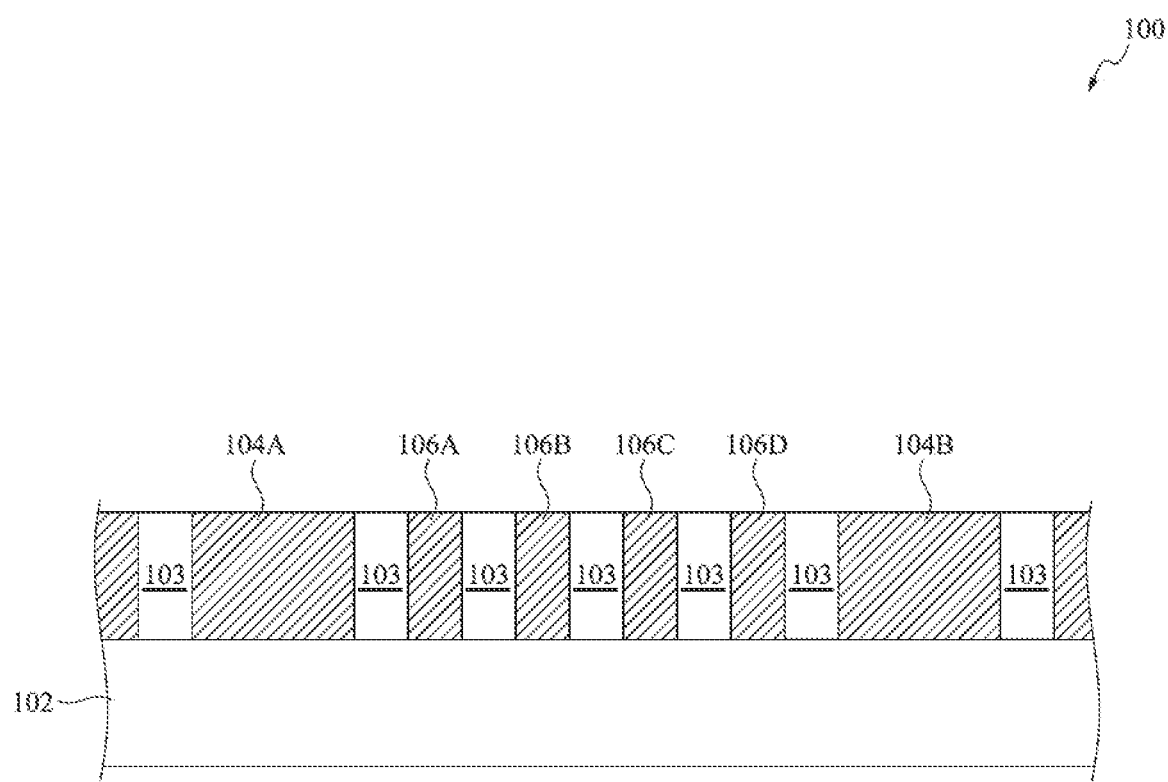

FIG. 27 is a cross-sectional view of the integrated circuit 100 at an intermediate stage of processing, according to one embodiment. A conductive material is deposited, etched, and planarized to form the supply tracks 104A and 104B and signal lines 106A-106D between the remaining portions of the first hard mask layer 103 as described in relation to FIGS. 16A and 16B. From there, the first hard mask layer 103 can be removed to produce the unit cell structure of supply tracks 104A and 104B and signal lines 106A-106D shown in FIGS. 1A and 1B.

Though not shown in FIGS. 22-27, after removal of the third spacer layer and before removal of the bottom layer 130, a process can be performed to pattern breaks in the signal lines 106B and 106C. The process can be the same process as was utilized to form the break in the signal line 106D, i.e., the remaining organic dielectric layer 124 (or other material) as shown and described in relation to FIGS. 3A-4B. In particular a mask stack of the same materials and properties as the mask stack 115 can be formed on the exposed portions of the integrated circuit 100. Trenches similar to the trench 121 can be formed corresponding to locations for the breaks in the signal lines 106B and 106C. An organic dielectric layer or other material can be deposited in the trenches and etched back, leaving organic dielectric layer 124 depositions selected to form breaks in the signal lines as described in relation to FIGS. 3A-4B.

Figure 28:
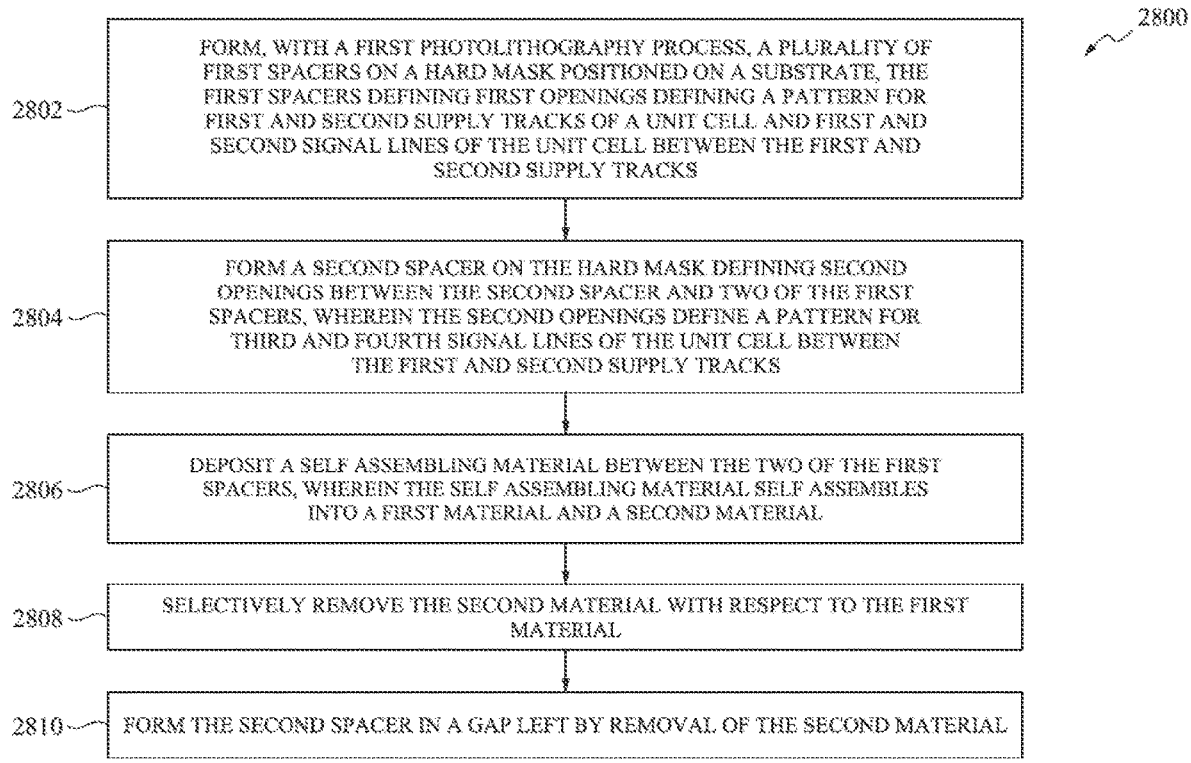
FIGS. 28-30 are flow diagrams of methods for forming an integrated circuit, in accordance with some embodiments.

FIG. 28 is a flow diagram of a method 2800 for forming an integrated circuit, according to one embodiment. At 2802, the method 2800 includes forming, with a first photolithography process, a plurality of first spacers on a hard mask positioned on a substrate, the first spacers defining first openings defining a pattern for first and second supply tracks of a unit cell and first and second signal lines of the unit cell between the first and second supply tracks. One example of first spacers are the first spacers 114 of FIG. 5A. One example of the hard mask is the first and second hard mask layers 103 and 110 of FIG. 2A. One example of a substrate is the substrate 102 of FIG. 1A. One example of first openings are the openings 122 of FIG. 6A. One example of the first and second supply tracks are the supply tracks 104A and 104B of FIG. 1A. One example of the first and second signal lines are the signal lines 106A and 106D of FIG. 1A. At 2804 the method 2800 includes forming a second spacer on the hard mask defining second openings between the second spacer and two of the first spacers, wherein the second openings define a pattern for third and fourth signal lines of the unit cell between the first and second supply tracks. One example of a second spacer is the spacer 146 of FIG. 12. One example of second openings is the openings 147 of FIG. 13. One example of third and fourth signal lines are the signal lines 106B and 106C of FIG. 1A. At 2806 forming the second spacer includes depositing a self assembling material between the two of the first spacers, wherein the self assembling material self assembles into a first material and a second material. One example of the first material is the first polymer material 140 of FIG. 10A. One example of the second material is the second polymer material 142 of FIG. 10A. At 2810 forming the second spacer includes selectively removing the second material with respect to the first material. At 2812 forming the second spacer can include forming the second spacer in a gap left by removal of the second material.

Figure 29:
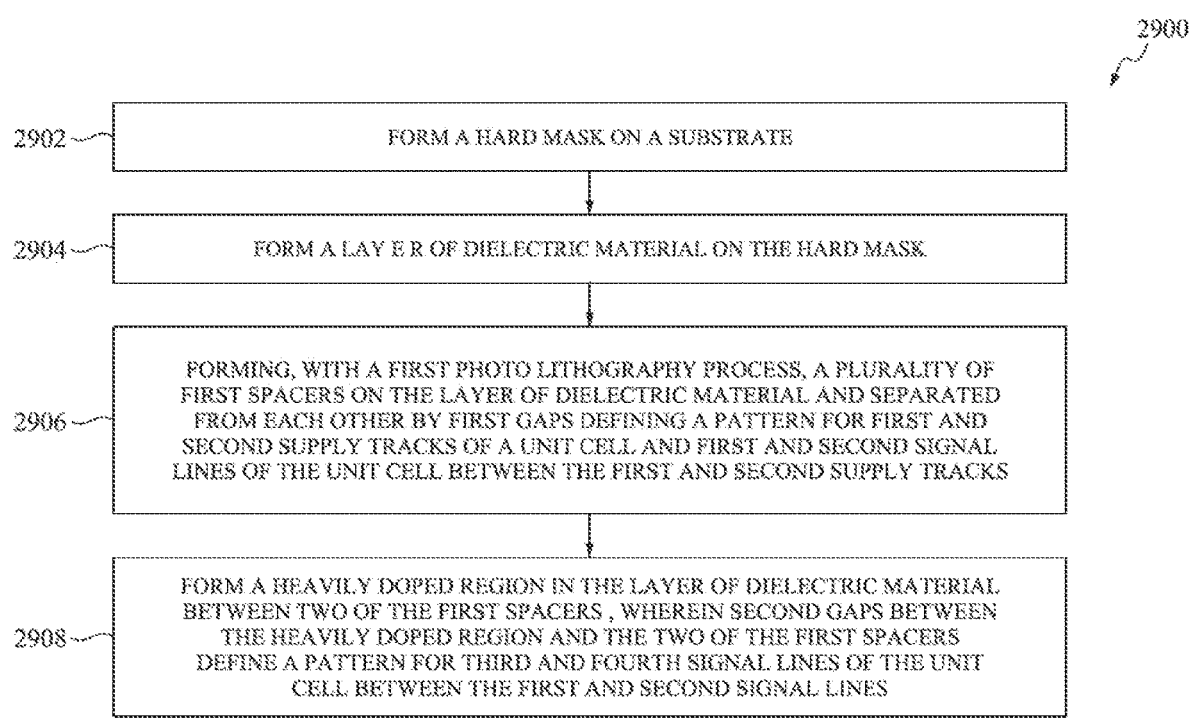

FIG. 29 is a flow diagram of a method 2900 for forming an integrated circuit, according to one embodiment. At 2902, the method 2900 includes forming a hard mask on a substrate. One example of the hard mask is the first and second hard mask layers 103 and 110 of FIG. 2A. One example of a substrate is the substrate 102 of FIG. 1A. At 2904, the method 2900 includes forming a layer of dielectric material on the hard mask. One example of the layer of dielectric material is the layer of dielectric material 150 of FIG. 16A. At 2906, the method 2900 includes forming, with a first photolithography process, a plurality of first spacers on the layer of dielectric material and separated from each other by first gaps defining a pattern for first and second supply tracks of a unit cell and first and second signal lines of the unit cell between the first and second supply tracks. One example of first spacers is the first spacers 114 of FIG. 5A. One example of first openings are the openings 122 of FIG. 6A. One example of first and second supply tracks 104A and 104B of FIG. 1A. One example of the first and second signal lines are the signal lines 106A and 106D of FIG. 1A. At 2908, the method 2900 includes forming a heavily doped region in the layer of dielectric material between two of the first spacers, wherein second gaps between the heavily doped region and two of the first spacers define a pattern for third and fourth signal lines of the unit cell between the first and second signal lines. One example of the heavily doped region is the heavily doped region 154 of FIG. 16A. One example of second gaps are the gaps 155 of FIG. 18.

Figure 30:
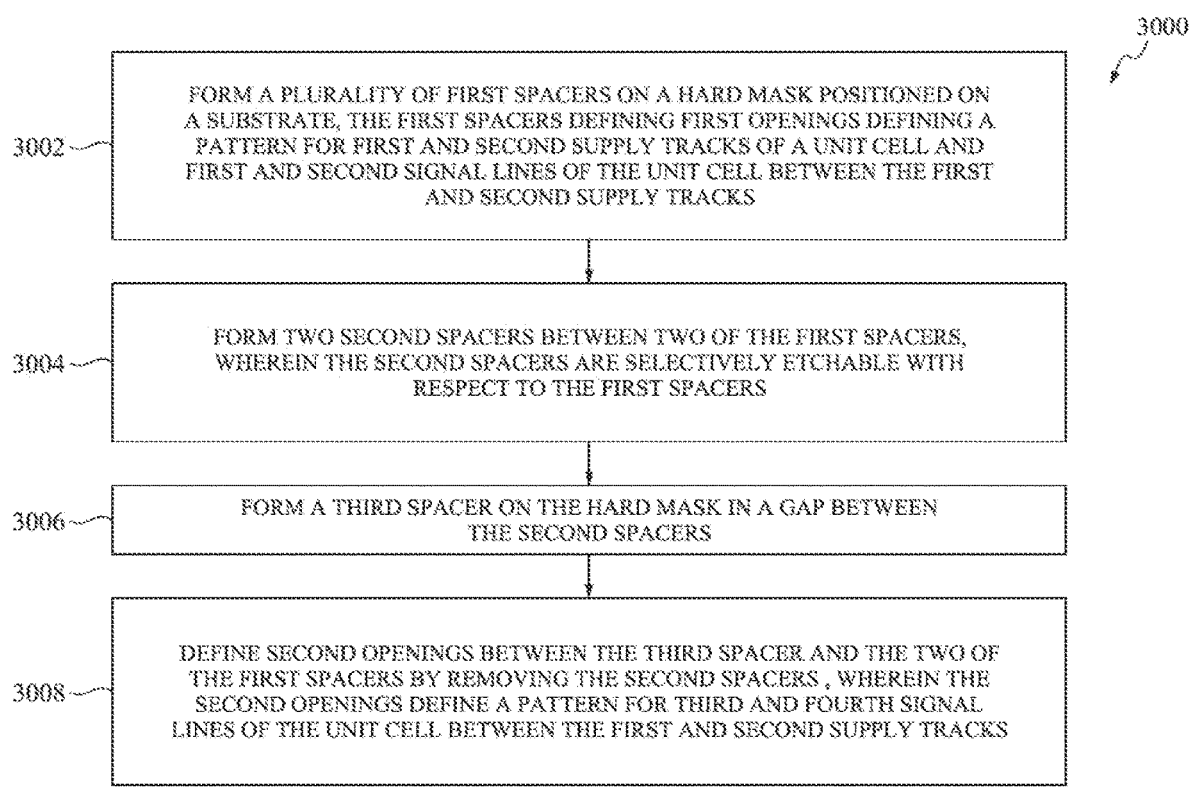

FIG. 30 is a flow diagram of a method 3000 for forming an integrated circuit, according to one embodiment. At 3002, the method 3000 includes forming a plurality of first spacers on a hard mask positioned on a substrate, the first spacers defining first openings defining a pattern for first and second supply tracks of a unit cell and first and second signal lines of the unit cell between the first and second supply tracks. One example of first spacers is the first spacers 114 of FIG. 5A. One example of the hard mask is the first and second hard mask layers 103 and 110 of FIG. 2A. One example of a substrate is the substrate 102 of FIG. 1A. One example of first openings are the openings 122 of FIG. 6A. One example of the first and second supply tracks are first and second supply tracks 104A and 104B of FIG. 1A. One example of the first and second signal lines are the signal lines 106A and 106D of FIG. 1A. At 3004, the method 3000 includes forming two second spacers between two of the first spacers, wherein the second spacers are selectively etchable with respect to the first spacers. One example of second spacers is the spacers 160 of FIG. 23. At 3006, the method 3000 includes forming a third spacer on the hard mask in a gap between the second spacers. One example of a third spacer is the spacer 162 of FIG. 24. At 3008, the method 3000 includes defining second openings between the third spacer and the two of the first spacers by removing the second spacers, wherein the second openings define a pattern for third and fourth signal lines of the unit cell between the first and second supply tracks. One example of second openings 163 is the openings 163 of FIG. 25. One example of third and fourth signal lines are the signal lines 106B and 106C of FIG. 1A.

One embodiment is a method of fabricating an integrated circuit including forming, with a first photolithography process, a plurality of first spacers on a hard mask positioned on a substrate. The first spacers define first openings defining a pattern for first and second supply tracks of a unit cell and first and second signal lines of the unit cell between the first and second supply tracks. The method includes forming a second spacer on the hard mask defining second openings between the second spacer and two of the first spacers. The second openings define a pattern for third and fourth signal lines of the unit cell between the first and second supply tracks, wherein forming the second spacer includes. Forming a second spacer includes depositing a self assembling material between the two of the first spacers, wherein the self assembling material self assembles into a first material and a second material, selectively removing the second material with respect to the first material, and forming the second spacer in a gap left by removal of the second material.

One embodiment is a method of fabricating an integrated circuit including forming a hard mask on a substrate, forming a layer of dielectric material on the hard mask, and forming, with a first photolithography process, a plurality of first spacers on the layer of dielectric material and separated from each other by first gaps defining a pattern for first and second supply tracks of a unit cell and first and second signal lines of the unit cell between the first and second supply tracks. The method includes forming a heavily doped region in the layer of dielectric material between two of the first spacers. The second gaps between the heavily doped region and the two of the first spacers define a pattern for third and fourth signal lines of the unit cell between the first and second signal lines.

One embodiment is method of fabricating an integrated circuit including forming a plurality of first spacers on a hard mask positioned on a substrate. The first spacers define first openings defining a pattern for first and second supply tracks of a unit cell and first and second signal lines of the unit cell between the first and second supply tracks. The method includes forming two second spacers between two of the first spacers, wherein the second spacers are selectively etchable with respect to the first spacers, forming a third spacer on the hard mask in a gap between the second spacers, and defining second openings between the third spacer and the two of the first spacers by removing the second spacers. The second openings define a pattern for third and fourth signal lines of the unit cell between the first and second supply tracks.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of fabricating an integrated circuit, comprising:
forming, with a first photolithography process, a plurality of first spacers on a hard mask positioned on a substrate, the first spacers defining first openings corresponding to a pattern for first and second supply tracks of a unit cell and first and second signal lines of the unit cell between the first and second supply tracks;
forming a second spacer on the hard mask defining second openings between the second spacer and two of the first spacers, wherein the second openings correspond to a pattern for third and fourth signal lines of the unit cell between the first and second supply tracks, wherein forming the second spacer includes:
depositing a self assembling material between the two of the first spacers, wherein the self assembling material self assembles into a first material and a second material;
selectively removing the second material with respect to the first material; and
forming the second spacer in a gap left by removal of the second material.

2. The method of claim 1, further comprising:
removing the first material;
patterning the hard mask by etching the hard mask in the presence of the first spacers and the second spacer; and
forming the first and second supply tracks and the first, second, third, and fourth signal lines by depositing a metal on areas of the substrate exposed by the hard mask.

3. The method of claim 2, wherein a pitch of the signal lines is less than 20 nm.

4. The method of claim 2, wherein the first and second supply tracks each have a width that is at least double a width of the individual signal lines of the unit cell.

5. The method of claim 2, further comprising defining a pattern for one or more breaks in the first and second signal lines by depositing an organic dielectric material on the hard mask at selected locations in the first openings based on a second photolithography process.

6. The method of claim 5, further comprising defining a pattern for one or more breaks in the third and fourth signal lines by depositing a dielectric material on the hard mask at selected locations in the second openings based on a second photolithography process.

7. The method of claim 1, wherein the first and second materials include polystyrene and polymethyl methacrylate.

8. The method of claim 1, wherein the first photolithography process is an extreme ultraviolet photolithography process.

9. A method of fabricating an integrated circuit, comprising:
forming a hard mask on a substrate;
forming a layer of dielectric material on the hard mask;
forming, with a first photolithography process, a plurality of first spacers on the layer of dielectric material and separated from each other by first gaps defining a pattern for first and second supply tracks of a unit cell and first and second signal lines of the unit cell between the first and second supply tracks; and
forming a heavily doped region in the layer of dielectric material between two of the first spacers, wherein second gaps between the heavily doped region and the two of the first spacers define a pattern for third and fourth signal lines of the unit cell between the first and second signal lines.

10. The method of claim 9, further comprising etching portions of the dielectric layer exposed by the first spacers with an etchant that does not etch the heavily doped region.

11. The method of claim 10, further comprising:
patterning the hard mask by etching the hard mask in the presence of the first spacers and the heavily doped region; and forming the first and second supply tracks and the first, second, third, and fourth signal lines by depositing a metal on areas of the substrate exposed by the hard mask.

12. The method of claim 11, wherein the layer of dielectric material includes silicon dioxide.

13. The method of claim 11, wherein the heavily doped region has a dopant concentration higher than 1E7 cm^−3.

14. The method of claim 9, wherein forming the heavily doped region includes performing an ion implantation process at two angles selected to dope a center region of the layer of dielectric material between the two of the first spacers more heavily than peripheral regions of the dielectric layer between the two of the first spacers.

15. The method of claim 13, wherein the dopant includes boron.

16. A method of fabricating an integrated circuit, comprising:
    forming a plurality of first spacers on a hard mask positioned on a substrate, the first spacers defining first openings corresponding to a pattern for first and second supply tracks of a unit cell and first and second signal lines of the unit cell between the first and second supply tracks;
    forming two second spacers between two of the first spacers, wherein the second spacers are selectively etchable with respect to the first spacers;
    forming a third spacer on the hard mask in a gap between the second spacers; and
    defining second openings between the third spacer and the two of the first spacers by removing the second spacers, wherein the second openings define a pattern for third and fourth signal lines of the unit cell between the first and second supply tracks.

17. The method of claim 16, further comprising:
    patterning the hard mask by etching the hard mask in the presence of the first spacers and the third spacer; and
    forming the first and second supply tracks and the first, second, third, and fourth signal lines by depositing a metal on areas of the substrate exposed by the hard mask.

18. The method of claim 16, wherein the first spacers and the third spacer are a same material.

19. The method of claim 16, wherein the first spacers include titanium oxide.

20. The method of claim 16, wherein forming the first spacers includes:
    depositing a layer of dielectric material on the hard mask;
    defining a plurality of mandrels from the layer of dielectric material by patterning the layer of dielectric material with a photolithography process;
    depositing a first spacer layer on the mandrels and on exposed areas of the hard mask between the mandrels; and
    defining the first spacers from the first spacer layer by removing the first spacer layer from the tops of the mandrels.

* * * * *